US012812054B2

(12) United States Patent
Adachi

(10) Patent No.: US 12,812,054 B2
(45) Date of Patent: Nov. 24, 2026

(54) CIRCUIT BOARD AND IMAGE FORMING APPARATUS

(71) Applicant: CANON KABUSHIKI KAISHA, Tokyo (JP)

(72) Inventor: Noriaki Adachi, Chiba (JP)

(73) Assignee: CANON KABUSHIKI KAISHA, Tokyo (JP)

(*) Notice: Subject to any disclaimer, the term of this patent is extended or adjusted under 35 U.S.C. 154(b) by 280 days.

(21) Appl. No.: 18/585,321

(22) Filed: Feb. 23, 2024

(65) Prior Publication Data

US 2024/0291926 A1 Aug. 29, 2024

(30) Foreign Application Priority Data

Feb. 28, 2023 (JP) ................................ 2023-029257
Aug. 9, 2023 (JP) ................................ 2023-130008

(51) Int. Cl.

| | |
|---|---|
| ***H04N 1/00*** | (2006.01) |
| ***H04N 1/23*** | (2006.01) |
| ***H10W 70/05*** | (2026.01) |
| ***H10W 70/40*** | (2026.01) |
| ***H10W 70/69*** | (2026.01) |

(52) U.S. Cl.

CPC ....... *H04N 1/00798* (2013.01); *H04N 1/2307* (2013.01); *H10W 70/095* (2026.01); *H10W 70/411* (2026.01); *H10W 70/461* (2026.01); *H10W 70/69* (2026.01)

(58) Field of Classification Search

CPC ............ H04N 1/00798; H04N 1/2307; H10W 70/095; H10W 70/411; H10W 70/461; H10W 70/69; H10W 70/65; H10W 40/228

USPC .......................................................... 358/443

See application file for complete search history.

(56) References Cited

U.S. PATENT DOCUMENTS 7,794,115 B2 * 9/2010 Hellinger ................ F21V 29/74 362/249.02
9,824,949 B2 * 11/2017 McKnight-MacNeil .................... H10W 70/20
10,424,994 B2 * 9/2019 Kabune ................ B62D 5/0412
10,679,926 B2 * 6/2020 Hugo ................... H05K 1/0206
2013/0135421 A1 * 5/2013 Takahashi .......... G03G 21/1666 359/200.1
2014/0268614 A1 * 9/2014 Zhang .................. H05K 1/0228 174/262
2018/0048255 A1 * 2/2018 Marvin ................... H02P 27/06
2021/0267043 A1 * 8/2021 Yoo ...................... H05K 1/0206
2021/0398964 A1 * 12/2021 Burke ................... H10W 40/22

FOREIGN PATENT DOCUMENTS

JP 2022006639 A 1/2022

* cited by examiner

*Primary Examiner* — Neil R McLean

(74) *Attorney, Agent, or Firm* — ROSSI, KIMMS & McDOWELL LLP

(57) ABSTRACT

A circuit board includes a first surface including a first region in which a first electronic part is mountable, and a second surface including a second region in which a second electronic part different from the first electronic part is mountable. The first region of the first surface and the second region of the second surface are provided at positions opposed to each other across the circuit board, and wherein the circuit board has a via for heat dissipation to be shared for heat dissipation of the first electronic part and the second electronic part formed therein to connect the first region and the second region to each other.

16 Claims, 14 Drawing Sheets

CIRCUIT BOARD AND IMAGE FORMING APPARATUS

BACKGROUND OF THE INVENTION

Field of the Invention

The present disclosure relates to a circuit board on which electronic parts for operating constituent parts such as actuators are mounted, and to an image forming apparatus, such as a printer, a copying machine, or a multifunction peripheral, including such a circuit board.

Description of the Related Art

An image forming apparatus includes a plurality of circuit boards for control of a plurality of actuators for use in forming an image. The circuit boards for control include a circuit board having a function of performing image processing control, and a circuit board having a function of sheet conveyance control. On each circuit board for control, a plurality of electronic parts are mounted in accordance with the function to be implemented. The plurality of electronic parts include an electronic part for performing a logic operation, an electronic part for performing drive control, and an electronic part for generating a power supply voltage. The electronic part on the circuit board is connected by a conductor wire such as a printed wiring line. Each electronic part forms, together with its surrounding electronic part, an electronic part component for implementing a predetermined function. For example, an integrated circuit and its surrounding electronic parts, such as a resistor, a capacitor, and an inductor, which are connected to input/output terminals of the integrated circuit, form the electronic part component.

The image forming apparatus prints an image on a sheet through a plurality of steps such as sheet conveyance, image formation, image transfer onto a sheet, and fixing of an image to the sheet. Accordingly, the image forming apparatus is required to control a wide variety of actuators, such as an optical sensor, a temperature sensor, a motor, and a solenoid. On the circuit board for control to be installed on the image forming apparatus, a plurality of electronic parts for controlling the actuators are mounted. For example, a driver board for driving a motor includes, in order to control the motor appropriately, an integrated circuit (motor driver IC) for generating a motor drive signal based on a control signal input from a controller (Japanese Patent Application Laid-open No. 2022-006639). Further, the circuit board for control itself is also provided as a plurality of circuit boards for control in the image forming apparatus.

Incidentally, the motor driver IC drives the motor, and hence a large current flows through the motor driver IC to cause heat generation. In view of the above, at least one embodiment of the present disclosure provides a circuit board with which heat dissipation performance of the electronic part can be improved.

SUMMARY OF THE INVENTION

A circuit board according to one embodiment of the present disclosure includes a first surface including a first region in which a first electronic part is mountable, and a second surface including a second region in which a second electronic part different from the first electronic part is mountable, wherein the first region of the first surface and the second region of the second surface are provided at positions opposed to each other across the circuit board, and wherein the circuit board has a via for heat dissipation to be shared for heat dissipation of the first electronic part and the second electronic part formed therein to connect the first region and the second region to each other.

An image forming apparatus according to another embodiment of the present disclosure includes a circuit board including a first surface including a first region in which a first electronic part is mountable, and a second surface including a second region in which a second electronic part different from the first electronic part is mountable, and a constituent part to be controlled by any of the first electronic part or the second electronic part mounted on the circuit board to form an image, wherein the circuit board is configured such that the first region of the first surface and the second region of the second surface are provided at positions opposed to each other across the circuit board, and a via for heat dissipation to be shared for heat dissipation of the first electronic part and the second electronic part is formed to connect the first region and the second region to each other.

Further features of the present invention will become apparent from the following description of exemplary embodiments (with reference to the attached drawings).

DESCRIPTION OF THE EMBODIMENTS

Now, description is given of at least one exemplary embodiment of the present disclosure with reference to the accompanying drawings.

<Configuration of Image Forming Apparatus>

Figure 1:
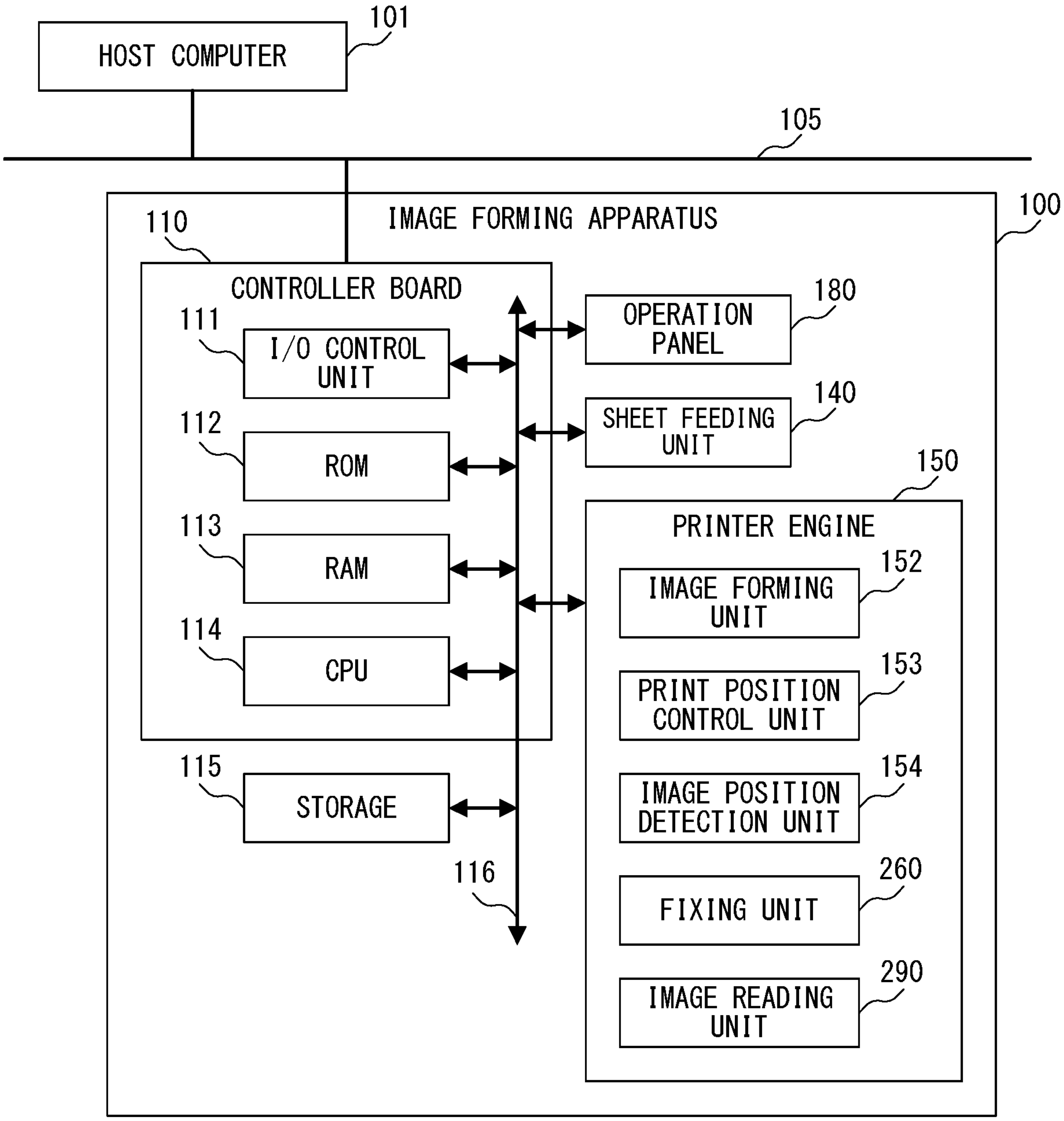
FIG. 1 is a system configuration diagram of an image forming apparatus.

FIG. 1 is a system configuration diagram of an image forming apparatus including a circuit board according to at least one embodiment of the present disclosure. It should be understood that, unless otherwise described, an image forming apparatus 100 may be a system including a plurality of apparatus connected to each other via a network, as long as functions of the image forming apparatus 100 can be implemented.

The image forming apparatus 100 according to the at least one embodiment is connected to a host computer 101 via a network 105 so that communication is allowed therebetween. The network 105 includes a communication network, such as a local area network (LAN), a wide area network (WAN), and a public network. A plurality of image forming apparatus 100 and a plurality of host computers 101 may be connected to the network 105. The host computer 101 generates a print job, and transmits the generated print job to the image forming apparatus 100 via the network 105.

The image forming apparatus 100 includes a controller board 110, a storage 115, a sheet feeding unit 140, a printer engine 150, and an operation panel 180. The controller board 110, the storage 115, the sheet feeding unit 140, the printer engine 150, and the operation panel 180 are connected to each other via a system bus 116 so that mutual communication is allowed therebetween.

The controller board 110 includes an I/O control unit 111, a read only memory (ROM) 112, a random access memory (RAM) 113, and a central processing unit (CPU) 114. The I/O control unit 111, the ROM 112, the RAM 113, and the CPU 114 are mounted on a circuit board. The controller board 110 functions as a main control unit of the image forming apparatus 100, and controls the operation of the entire image forming apparatus 100. The circuit board is, for example, a printed wiring board having printed wiring formed thereon.

The I/O control unit 111 controls communication to/from an external apparatus such as the host computer 101 via the network 105. The CPU 114 executes a computer program stored in the ROM 112 or the storage 115 to control an operation such as image forming processing to be performed by the image forming apparatus 100. The RAM 113 provides a work area used in a case where the CPU 114 executes processing, and performs storage of temporal data or the like. The storage 115 stores large-capacity data, such as image data or print data, on a temporary or long-term basis. For example, the storage 115 stores image data for generating an image for adjustment for use in adjusting an image forming condition. The storage 115 is a large-capacity storage device, such as a hard disk drive (HDD) or a solid state drive (SSD). Computer programs, such as a startup program, a control program, and an operation system, to be executed by the CPU 114 are stored in the ROM 112 and the storage 115.

The operation panel 180 is a user interface including an input interface and an output interface. The input interface is, for example, key buttons and a touch panel. The output interface is a display, a speaker, and the like. The operation panel 180 receives an instruction or the like through the operation of the user and inputs the received instruction or the like to the CPU 114. The CPU 114 controls the operation of the image forming apparatus 100 in accordance with the instruction. Further, the operation panel 180 displays a state of the image forming apparatus 100 and various setting screens in accordance with the instruction from the CPU 114.

The sheet feeding unit 140 includes a sheet feeding device including one or more sheet feeding stages, and an entire conveying unit for conveying a sheet from one of the sheet feeding stages to a sheet discharging unit. The sheet feeding unit 140 feeds sheets one by one from the sheet feeding stage in accordance with the instruction from the CPU 114.

The printer engine 150 includes an image forming unit 152, a print position control unit 153, an image position detection unit 154, a fixing unit 260, and an image reading unit 290. The image forming unit 152 forms an image (toner image) on the sheet fed by the sheet feeding unit 140. The fixing unit 260 fixes the image (toner image) to the sheet. The image reading unit 290 reads the image for adjustment printed on the image. The image position detection unit 154 detects an image position on the sheet based on results of reading the image for adjustment by the image reading unit 290. The print position control unit 153 controls the position of the image to be formed on the sheet based on the image position detected by the image position detection unit 154.

Figure 2:
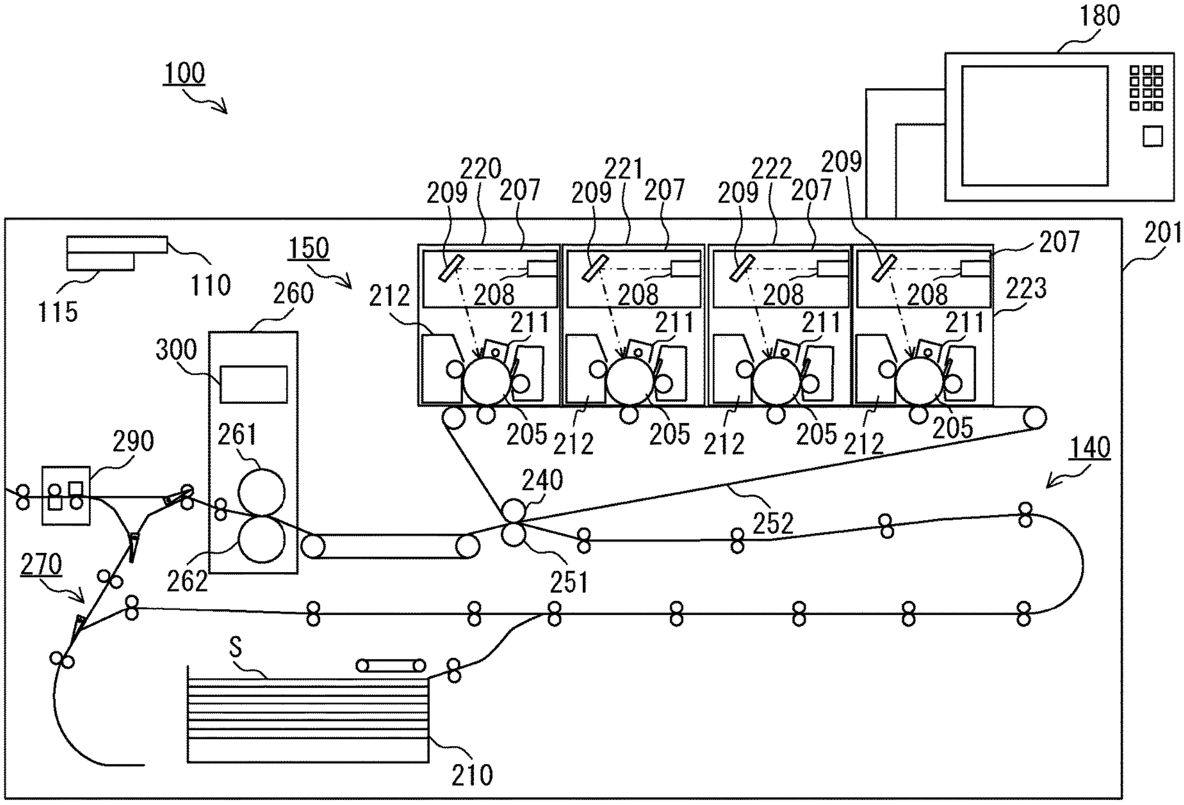
FIG. 2 is a configuration view of the image forming apparatus.

FIG. 2 is a configuration view of the image forming apparatus 100. The image forming apparatus 100 includes the operation panel 180 above a casing 201. Inside of the casing 201, the controller board 110, the storage 115, the sheet feeding unit 140, and the printer engine 150 illustrated in FIG. 1 are provided. The printer engine 150 includes mechanisms forming an engine unit, and an engine control unit for performing control of processing to be performed by each mechanism. The mechanisms forming the engine unit include an optical processing mechanism and a fixing processing mechanism. The optical processing mechanism is used for forming an electrostatic latent image, visualizing the electrostatic latent image, and transferring the visualized image onto a sheet S. The fixing processing mechanism fixes the toner image transferred onto the sheet S.

The image forming unit 152 of the printer engine 150 corresponds to the optical processing mechanism, and includes a Y station 220, an M station 221, a C station 222, a K station 223, an intermediate transfer belt 252, and a secondary transfer outer roller 251. The Y station 220, the M station 221, the C station 222, and the K station 223 have the same configuration, and only differ in colors of images to be formed. The Y station 220 forms a yellow image. The M station 221 forms a magenta image. The C station 222 forms a cyan image. The K station 223 forms a black image. The configuration of the Y station 220 is described here, and description of the configurations of the M station 221, the C station 222, and the K station 223 is omitted.

The Y station 220 includes a photosensitive drum 205, a charging device 211, an exposing device 207, and a developing device 212. The photosensitive drum 205 is a drum-shaped photosensitive member having a photosensitive layer on its surface. The charging device 211 uniformly charges the surface of the photosensitive drum 205 that rotates about a drum shaft. The exposing device 207 scans the charged surface of the photosensitive drum 205 with laser light modulated in accordance with the image data.

The exposing device 207 includes a laser driver, a rotary polygon mirror 208, and a reflecting mirror 209. The laser driver controls light emission of a semiconductor laser (not shown) in accordance with the image data acquired from the CPU 114. The laser light emitted from the semiconductor laser moves in a main scanning direction in accordance with the rotation of the rotary polygon mirror 208, and is guided by the reflecting mirror 209 to the surface of the photosensitive drum 205. The surface of the photosensitive drum 205 is exposed with light so that an electrostatic latent image is formed thereon.

The developing device 212 visualizes the electrostatic latent image with toner to form a toner image on the surface of the photosensitive drum 205. A yellow toner image is formed on the photosensitive drum 205 of the Y station 220. A magenta toner image is formed on the photosensitive drum 205 of the M station 221. A cyan toner image is formed on the photosensitive drum 205 of the C station 222. A black toner image is formed on the photosensitive drum 205 of the K station 223.

The intermediate transfer belt 252 is looped around rollers such as a secondary transfer inner roller 240, and rotates in the clockwise direction of FIG. 2. The toner images of the respective colors formed on the respective photosensitive drums 205 are transferred in a superimposing manner onto the rotating intermediate transfer belt 252. The toner image is transferred from the photosensitive drum 205 onto the intermediate transfer belt 252 by applying a bias voltage having a polarity reverse to that of the toner image to the intermediate transfer belt 252. In this manner, the intermediate transfer belt 252 bears a full-color toner image. The intermediate transfer belt 252 rotates to convey the borne toner image to a secondary transfer portion formed of the secondary transfer inner roller 240 and the secondary transfer outer roller 251.

The sheet feeding unit 140 corresponds to a feeding mechanism for the sheet S, and includes a storage unit 210 for storing the sheets S, conveyance paths, and conveying rollers. The sheet feeding unit 140 conveys the sheets S from the storage unit 210 one by one to the secondary transfer portion. The secondary transfer portion nips and conveys the intermediate transfer belt 252 and the sheet S by the secondary transfer inner roller 240 and the secondary transfer outer roller 251. At this time, a bias voltage having a polarity reverse to that of the toner image is applied to the secondary transfer outer roller 251 so that the toner image is transferred from the intermediate transfer belt 252 onto the sheet S.

The sheet S having the toner image transferred thereon is conveyed to the fixing unit 260 corresponding to the fixing processing mechanism. The fixing unit 260 includes a fixing roller 261, a pressure roller 262, and a circuit board 300. The fixing roller 261 incorporates a heat source. The pressure roller 262 is urged to the fixing roller 261 side. The circuit board 300 controls the fixing processing to be performed by the fixing unit 260. The fixing unit 260 nips and conveys the sheet S having the toner image transferred thereon by the fixing roller 261 and the pressure roller 262 so that the toner image is fixed to the sheet S. At this time, the fixing roller 261 heats and melts the toner image, and presses the sheet S between the fixing roller 261 and the pressure roller 262.

In the manner described above, the image is printed on the sheet S. In a case of duplex printing, the sheet S having the image printed on its first surface is re-conveyed to the secondary transfer portion via a reverse path 270. Through conveyance to the secondary transfer portion via the reverse path 270, an image forming surface of the sheet S is reversed. On the sheet S whose image forming surface has been reversed, an image is printed on a second surface different from the first surface by the secondary transfer portion and the fixing unit 260.

The sheet S having the image printed thereon passes through the image reading unit 290 provided on the downstream side of the fixing unit 260 in a conveying direction of the sheet so as to be discharged to the outside of the image forming apparatus 100. In a case where the image formed on the sheet S is the image for adjustment for adjusting the image forming condition, the image reading unit 290 is used for reading of this image for adjustment.

First Embodiment

In order to perform the image forming processing as described above, the image forming apparatus 100 incorporates various actuators, such as motors and sensors. The actuators are each connected to a circuit board having electronic parts for control mounted thereon. Each electronic part mounted on the circuit board is connected by a conductive wire. The circuit board according to a first embodiment of the present disclosure is, for example, a printed wiring board using a printed wiring line as the conductive wire.

The electronic part controls the operation of the actuator. A large number of circuit boards are thus provided in the image forming apparatus 100 so as to correspond to the actuators. One or more actuators are controlled by one circuit board. The circuit board is controlled by the CPU 114. The controller board 110 on which the CPU 114 is mounted is also an example of the circuit board.

<Circuit Board>

Figure 3:
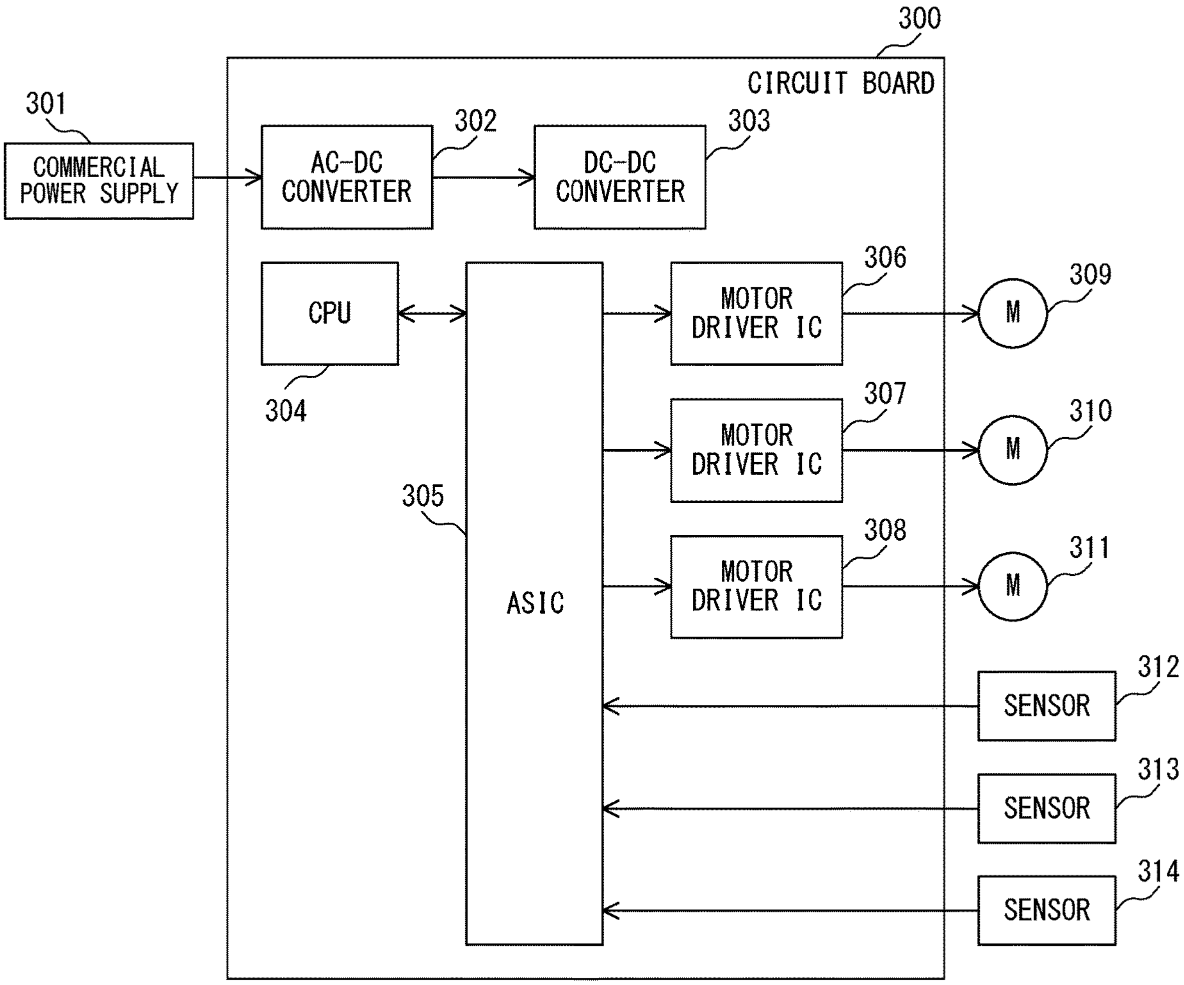
FIG. 3 is a functional block diagram of a circuit board.

FIG. 3 is a functional block diagram of the circuit board 300 provided in the fixing unit 260. A plurality of motors 309 to 311 in the fixing unit 260 and a plurality of sensors 312 to 314 in the fixing unit 260 are electrically connected to the circuit board 300. The motor 309 is a drive source for driving the fixing roller 261 being a rotary member. The motor 310 is a drive source for urging the pressure roller 262 to the fixing roller 261 side. The motor 311 is a drive source for driving a roller being a rotary member for conveying the sheet S that has been subjected to the fixing processing to the downstream. The sensor 312 is a detector for detecting the sheet S that has been conveyed to the fixing unit 260. The sensor 313 is a temperature detector for detecting the temperature of the fixing roller 261. The sensor 314 is a detector for detecting the sheet S that has been subjected to the fixing processing.

The circuit board 300 implements various functions by a plurality of electronic parts. In the example of FIG. 3, the circuit board 300 includes an AC-DC converter 302 and a DC-DC converter 303. The AC-DC converter 302 is used for generating a predetermined DC voltage from an AC voltage. The DC-DC converter 303 converts a voltage value of the DC voltage. The circuit board 300 further includes a CPU 304, an application specific integrated circuit (ASIC) 305, and motor driver ICs 306 to 308, which are used for control of the actuators. On the circuit board 300, the plurality of integrated circuits (hereinafter referred to as "ICs") and surrounding electronic parts corresponding to the respective ICs as described above are mounted as electronic parts.

The AC-DC converter 302 generates, from AC power supplied from a commercial power supply 301, a first power supply voltage which is a DC voltage having a predetermined voltage value. The DC-DC converter 303 generates, from the first power supply voltage supplied from the AC-DC converter 302, a second power supply voltage which is a DC voltage having a voltage value different from that of the first power supply voltage. The second power supply voltage generated by the DC-DC converter 303 is supplied to the CPU 304, the ASIC 305, and the like. The CPU 304 and the ASIC 305 operate by using the second power supply voltage supplied from the DC-DC converter 303. The first power supply voltage output from the AC-DC converter 302 is supplied not only to the DC-DC converter 303 but also to the motors 309 to 311 and electronic parts that operate in a voltage value different from that of the CPU 304 or the ASIC 305.

The CPU 304 is connected to each of the motor driver ICs 306 to 308 and each of the sensors 312 to 314 via the ASIC 305. The CPU 304 acquires detection results obtained by the sensors 312 to 314 to detect the state of the fixing unit 260 from the detection results. The CPU 304 controls each of the motor driver ICs 306 to 308 via the ASIC 305 in accordance with the detected state of the fixing unit 260, to thereby control the drive of each of the motors 309 to 311. As described above, the CPU 304 and the ASIC 305 control the operation of the fixing unit 260.

The circuit board 300 is provided in the fixing unit 260 and thus controls the operation of the fixing unit 260, but other circuit boards provided in the image forming apparatus 100 similarly control operations of corresponding constituent parts. Each of the circuit boards in the image forming apparatus 100 (including the circuit board 300 and other circuit boards) is connected to the controller board 110 so that communication is allowed therebetween. Communication is allowed between circuit boards via the controller board 110. The circuit boards appropriately control the constituent parts in the image forming apparatus 100 while mutually sharing information on the detection results obtained by the sensors and the control states of the motors.

A large number of electronic parts are mounted on the circuit board. However, for various reasons such as distribution, environment, and accidents, there is a possibility that a situation in which it becomes difficult to procure a part of the large number of electronic parts occurs. In order to cope with the situation in which there is an electronic part that is difficult to procure, there is known a method of making research in advance for an electronic part having the same or similar shape and specification as each of the electronic parts, as a replacement part. In a case where a problem occurs in part procurement, the replacement part may be procured and mounted on the circuit board so that the manufacture of the circuit board 300 is continued.

However, a part of electronic parts such as the motor driver IC varies in size, terminal arrangement, and the like depending on the manufacturer or a slight difference in specification. Accordingly, it is difficult for a circuit board to have wiring with a common foot pattern for different electronic parts. For example, in the case of the circuit board 300, in some cases, a specific IC such as an IC of the DC-DC converter 303 or the motor driver IC 306, 307, or 308 requires a unique surrounding part in using the IC. Further, in some cases, there is no replaceable IC because the number of terminals, arrangement, array, or electrical specification of the IC is different. As a countermeasure, it is conceivable to prepare a plurality of circuit boards for every plurality of electronic parts that implement the same function. However, manufacturing and managing a plurality of circuit boards for a genuine product and a replacement product may cause increase in inspection/management cost or confusion in a manufacturing process. In view of the above, it is desired to provide a foot pattern corresponding to a plurality of electronic parts that implement the same function on one circuit board in advance so that the same function is implemented by switching mounting/unmounting of the electronic part. In order to cope with the situation in which the procurement of each electronic part becomes difficult, a different electronic part component having the same function as that of an electronic part component including each IC and its surrounding part is prepared. Those electronic part components are exclusively mounted on the circuit board. With this coping method, a procurable IC is mounted depending on the availability of the mounting part, and hence the manufacture of the circuit board 300 can be continued.

Accordingly, in general, a plurality of through vias for heat dissipation are formed in a region of the circuit board in which the motor driver IC is to be mounted. However, a signal pattern cannot be wired at a portion in which the through via is formed. Providing wiring patterns for mounting the genuine-product and replacement-product motor driver ICs on one circuit board without passing through the through vias causes increase in substrate area (size). Such a circuit board is also required to decrease the substrate area.

Incidentally, the motor driver IC drives the motor, and hence a large current flows through the motor driver IC to cause heat generation. The circuit board 300 of the first embodiment has a configuration capable of coping with the situation in which part procurement is difficult, and is further capable of reducing the area required for mounting without losing the heat dissipation performance of the electronic part.

An object of applying such a design is not limited to coping with the situation in which the part procurement is difficult. For example, in a case where parts of functions are shared in a plurality of product lineups, in some cases, a different electronic part component having the same function as that of an electronic part component including each IC and its surrounding part is prepared.

Now, description is given of a specific circuit configuration and wiring (conductor pattern) of the circuit board 300. In the first embodiment, description is given through use of a configuration of a motor driver IC for controlling a two-phase bipolar-drive stepping motor.

<Electronic Part Component>

Figure 4:
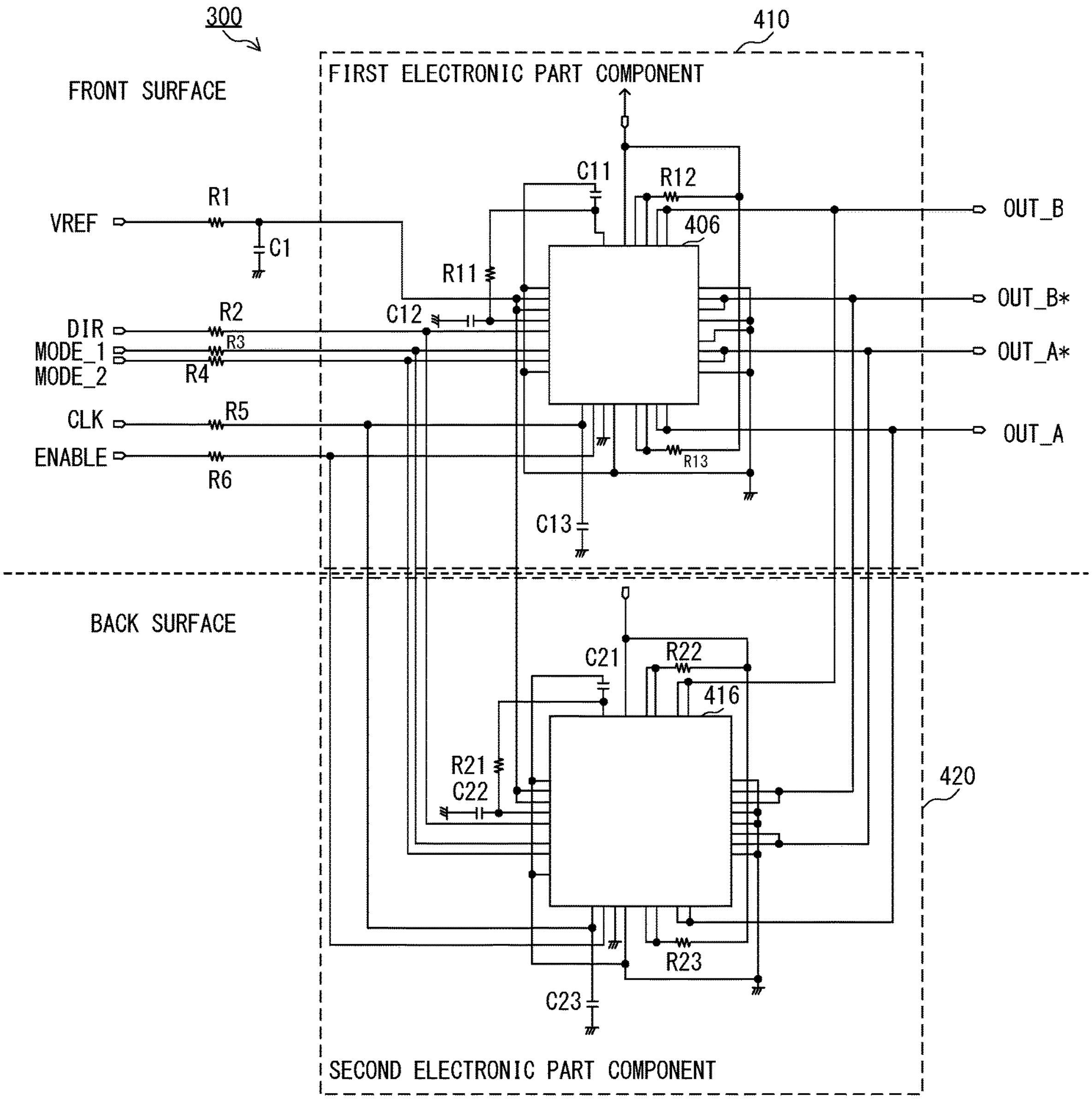
FIG. 4 is an explanatory diagram of electronic part components.

FIG. 4 is an explanatory view of electronic part components each including a motor driver IC and its surrounding part. Those electronic part components are a first electronic part component 410 including a motor driver IC 406, and a second electronic part component 420 including a motor driver IC 416 which is a replacement product of the motor driver IC 406. The first electronic part component 410 can be mounted on a first surface (front surface) of the circuit board 300. The second electronic part component 420 can be mounted on a second surface (back surface) different from the first surface of the circuit board 300. The first electronic part component 410 and the second electronic part component 420 are exclusively mounted on the circuit board 300.

The first electronic part component 410 includes resistors R11, R12, and R13 and capacitors C11, C12, and C13 in addition to the motor driver IC 406. The resistors R12 and R13 are detection resistors for detecting currents. The resistor R11 is a resistor for determining a chopping frequency of constant-current pulse width modulation (PWM) control at the time of controlling a motor current. The capacitors C11, C12, and C13 are each provided for noise removal.

Similarly, the second electronic part component 420 includes resistors R21, R22, and R23 and capacitors C21, C22, and C23 in addition to the motor driver IC 416. The resistors R22 and R23 are detection resistors for detecting currents. The resistor R21 is a resistor for determining a chopping frequency of constant-current PWM control at the time of controlling a motor current. The capacitors C21, C22, and C23 are each provided for noise removal.

Control signals branched from the ASIC 305 via damping resistors R1 to R6 are input to the motor driver ICs 406 and 416. The control signals include an ENABLE signal, a CLK signal, a VREF signal, a MODE signal (MODE_1 signal and MODE_2 signal), and a DIR signal. The ENABLE signal is a control signal for enabling the output of the motor driver ICs 406 and 416. The CLK signal is a control signal for controlling a speed of the motor. The VREF signal is a control signal for controlling a value of current flowing through the motor. The MODE signal is a control signal for controlling an excitation pattern of the motor. The DIR signal is a control signal for controlling a rotation direction of the motor. The motor driver ICs 406 and 416 can drive the motor in accordance with an instruction obtained by those control signals. Phase output signals (OUT_A, OUT_A*, OUT_B, and OUT_B*) output from the motor driver ICs 406 and 416 are connected through vias in the shortest distance so as to be input to the motor. The operation of the motor is controlled by those signals (OUT_A, OUT_A*, OUT_B, and OUT_B*) input from the motor driver ICs 406 and 416.

In the description above, the first electronic part component 410 and the second electronic part component 420 are exclusively mounted on the circuit board 300. However, the circuit board 300 may have a configuration in which exclusive mounting is achieved not in units of electronic part components but in units of ICs. For example, the motor driver IC 406 and the motor driver IC 416 may be exclusively mounted on the circuit board 300. In this case, for example, the resistors R11, R12, and R13 and the capacitors C11, C12, and C13 may be shared by the motor driver IC 416, and the resistors R21, R22, and R23 and the capacitors C21, C22, and C23 may be omitted.

<Mounting Region of Circuit Board>

Figure 5:
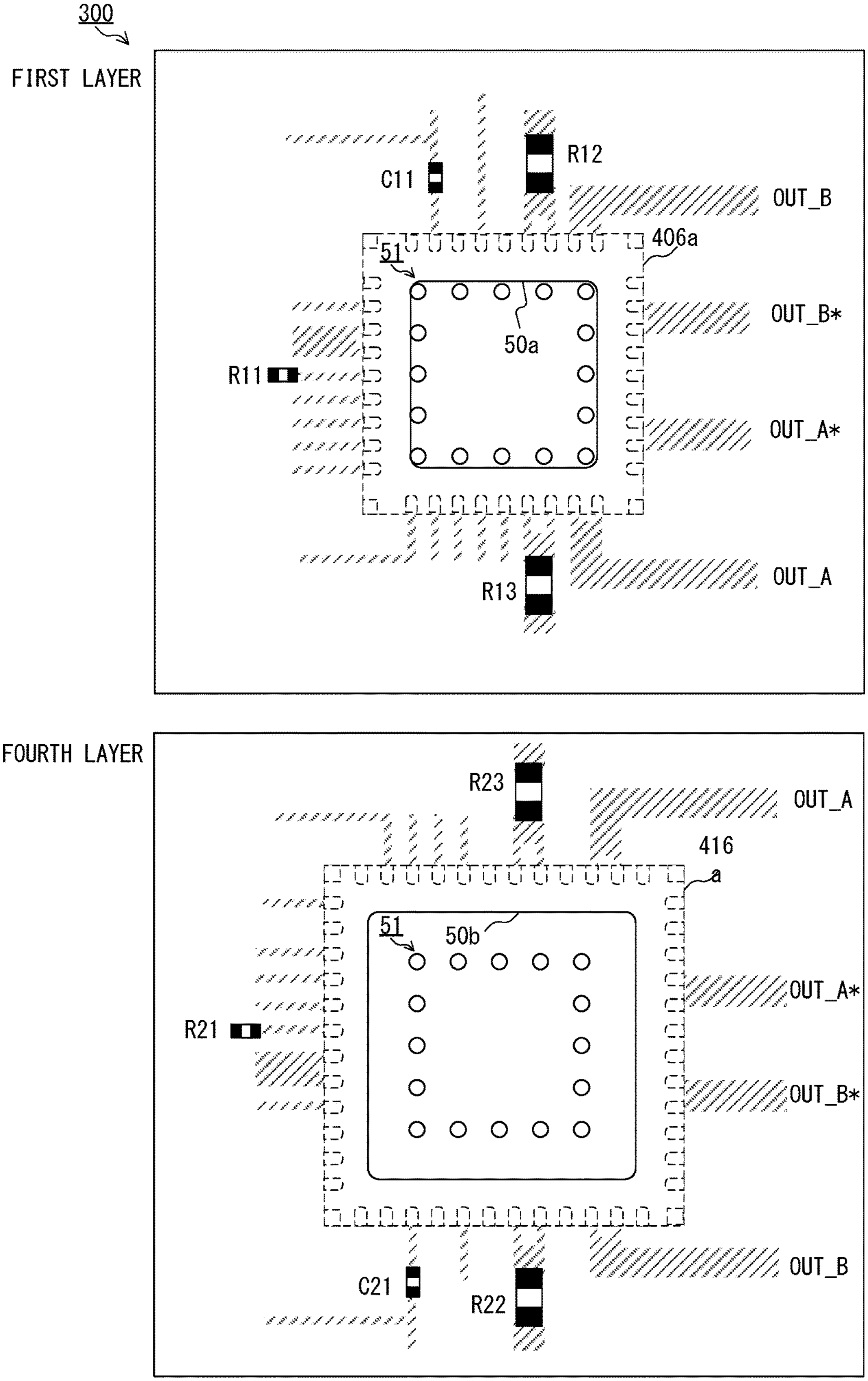
FIG. 5 is an explanatory view of wiring patterns of the circuit board.

FIG. 5 is an explanatory view of wiring patterns in a region of the circuit board 300 in which the electronic part component is to be mounted. The circuit board 300 has a multilayer structure. In the first embodiment, the circuit board 300 has a four-layer structure in which the second layer is a power supply layer and the third layer is a ground layer. Description of wiring patterns of the second layer and the third layer is omitted. Electronic part components can be mounted on the first layer and the fourth layer. That is, the electronic part component is mounted on the outermost layer of the multilayer structure. The wiring pattern is formed by, for example, a printing technique through use of a conductor such as copper foil.

In the first embodiment, as described with reference to FIG. 4, the first electronic part component 410 and the second electronic part component 420 are exclusively provided on the front surface (first layer) and the back surface (fourth layer) of the circuit board 300, respectively. The first electronic part component 410 includes the motor driver IC 406. The second electronic part component 420 includes the motor driver IC 416 which is the replacement product of the motor driver IC 406. A mounting region 406*a* for the motor driver IC 406 on the front surface and a mounting region 416*a* for the motor driver IC 416 on the back surface are provided at the same positions (coordinate regions) opposed to each other across the circuit board 300 (second layer and third layer). Wiring patterns are formed so that the motor driver ICs 406 and 416 can be mounted in those mounting regions 406*a* and 416*a*.

The first layer of the circuit board 300 is formed so that the motor driver IC 406 can be mounted in the mounting region 406*a*. The fourth layer of the circuit board 300 is formed so that the motor driver IC 416 can be mounted in the mounting region 416*a*. The motor driver IC 406 includes, on its back surface, a die pad 50*a* for supporting and fixing a semiconductor element. The motor driver IC 416 includes, on its back surface, a die pad 50*b* for supporting and fixing a semiconductor element.

The die pads 50*a* and 50*b* and a ground pattern of the circuit board 300 are connected to each other with solder so that heat of the motor driver ICs 406 and 416 is dissipated to the circuit board 300. Further, in a part of the circuit board 300 to be connected to the die pads 50*a* and 50*b* of the respective motor driver ICs 406 and 416, in order to enhance the heat dissipation effect, a plurality of common vias 51 for heat dissipation that are compatible with both of the motor driver ICs 406 and 416 are formed. That is, the plurality of vias 51 for heat dissipation are formed so as to pass through and connect the mounting region 406*a* and the mounting region 416*a*.

The vias 51 for heat dissipation are each a through via. In a case where the vias 51 for heat dissipation are formed so as to correspond to each of the motor driver IC 406 and the motor driver IC 416, the wiring pattern is formed without passing through the vias 51 for heat dissipation, and hence there is a possibility that routing of the wiring pattern becomes complicated. This disadvantage increases the area of the circuit board 300, and hence downsizing of the entire apparatus is hindered.

The first embodiment provides a configuration in which the motor driver IC 406 having a smaller package size is arranged in the first layer, and the motor driver IC 416 having a larger package size is arranged in the fourth layer. The common vias 51 for heat dissipation are formed within the mounting region 406*a* for the motor driver IC 406 having a smaller package size. The electronic parts are exclusively mounted on both surfaces of the circuit board 300, and the vias 51 for heat dissipation are formed in a common mounting region for the electronic parts. Thus, the entire apparatus can be downsized without hindering the routing of the wiring pattern.

Figure 6:
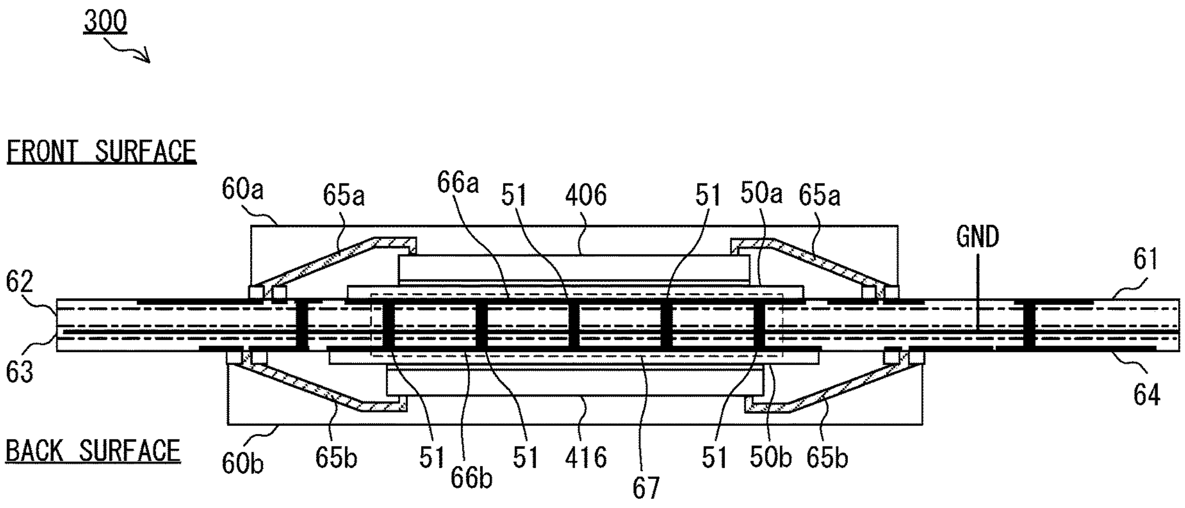
FIG. 6 is a cross-sectional view of a part of the circuit board in which a motor driver IC is mounted.

FIG. 6 is a cross-sectional view of a part of the circuit board 300 in which the motor driver IC is mounted. As described above, the circuit board 300 includes four layers of a first layer 61, a second layer 62, a third layer 63, and a fourth layer 64. The circuit board 300 is a double-sided reflow board, and electronic parts are mounted on the first layer 61 and the fourth layer 64.

As described above, the first electronic part component 410 including the motor driver IC 406 is mounted on the first layer 61 corresponding to the front surface, and the second electronic part component 420 including the motor driver IC 416 is mounted on the fourth layer 64 corresponding to the back surface. The first electronic part component 410 and the second electronic part component 420 are exclusively mounted. That is, the electronic part component (or the motor driver IC) is mounted on only one of the front surface or the back surface of the circuit board 300.

The motor driver IC 406 is a semiconductor device which is incorporated in a case 60*a* and is to be mounted on the die pad 50*a*. The motor driver IC 406 is bonded by wires 65*a* in the case 60*a*. The motor driver IC 416 is a semiconductor device which is incorporated in a case 60*b* and is to be mounted on the die pad 50*b*. The motor driver IC 416 is bonded by wires 65*b* in the case 60*b*.

The second layer 62 is the power supply layer. The second layer 62 includes wiring lines for supplying power to the motor driver ICs 406 and 416 and wiring lines for supplying a low voltage for driving a logic circuit, such as a CPU or an ASIC. The third layer 63 is the ground (GND) layer, and is connected to ground patterns of the first layer 61 and the fourth layer 64 through vias. The third layer 63 provides a common ground voltage to the first layer 61 and the fourth layer 64.

A plurality of vias surrounded by a broken line 67 are the vias 51 for heat dissipation, and are formed to enhance the heat dissipation effect of the motor driver ICs 406 and 416. The vias 51 for heat dissipation can be brought into contact with the die pads 50*a* and 50*b* of both of the motor driver IC 406 and the motor driver IC 416, and are shared by the motor driver ICs 406 and 416. Heat of the motor driver IC 406 and the motor driver IC 416 is dissipated by the vias 51 for heat dissipation via the die pads 50*a* and 50*b*.

The vias 51 for heat dissipation and the die pad 50*a* are brought into contact with each other through intermediation of a wiring pattern 66*a* for heat dissipation. The vias 51 for heat dissipation and the die pad 50*b* are brought into contact with each other through intermediation of a wiring pattern 66*b* for heat dissipation. The wiring pattern 66*a* for heat dissipation is formed on the first layer 61 so as to come into contact with the entire surface of the die pad 50*a*. The wiring pattern 66*b* for heat dissipation is formed on the fourth layer 64 so as to come into contact with the entire surface of the die pad 50*b*. The wiring patterns 66*a* and 66*b* for heat dissipation come into contact with the entire surfaces of the respective die pads 50*a* and 50*b* to enhance the heat dissipation efficiency.

The circuit board 300 configured as described above can exclusively mount electronic parts (semiconductor devices) such as ICs for implementing the same function, or electronic part components each including a plurality of electronic parts. One electronic part or electronic part component is mounted on the first surface (front surface) of the circuit board 300, and another electronic part or electronic part component is mounted on the second surface (back surface) of the circuit board 300. The one electronic part or electronic part component and the another electronic part or electronic part component are arranged at positions opposed to each other across the circuit board.

The circuit board 300 has the vias 51 for heat dissipation formed as a heat dissipation measure of the electronic part. The vias 51 for heat dissipation are shared by the electronic parts or the electronic part components which are exclusively mounted. Accordingly, the vias 51 for heat dissipation are formed to pass through the circuit board 300 at mounting positions for the electronic parts or the electronic part components. The vias 51 for heat dissipation are formed as described above, and hence the circuit board 300 can be minimized in area without losing the heat dissipation performance.

With such a configuration, while a part acquisition risk that occurs in procurement of an electronic part to be mounted is suppressed, the circuit board 300 can be continuously manufactured through use of a replacement product even in a case where the electronic part lacks. Further, the circuit board 300 can be minimized in size without losing the heat dissipation performance of the electronic part.

In the first embodiment, the motor driver ICs 406 and 416 are described as examples of the electronic parts (semiconductor devices), but the electronic parts (semiconductor devices) are not limited thereto. The functions of the electronic parts (semiconductor devices) are not limited as long as the electronic parts (semiconductor devices) are configured to be mounted on the die pads 50*a* and 50*b*. For example, the electronic parts (semiconductor devices) may be DC-DC converters, switching ICs, field effect transistors (FETs), and the like. Further, the present disclosure is effective even in a case where the electronic parts or the electronic part components implement different functions as long as the electronic parts or the electronic part components are exclusively mounted.

Second Embodiment

In a configuration in which electronic parts or electronic part components can be mounted on both surfaces of the circuit board 300 as in the first embodiment, for example, in a case where the electronic part is soldered, there is a possibility that solder leaks from one surface to another surface through the via 51 for heat dissipation. Such leakage of solder causes shortage of a solder amount between the electronic part and the mounting region. Shortage of the solder amount causes reduction in the heat dissipation property of the electronic part. Further, there is a possibility that the leaking solder causes unintended electrical connection to hinder the circuit board from implementing a predetermined function, resulting in reduction in yield of the circuit board. In a second embodiment of the present disclosure, description is given of a configuration for preventing such outflow of solder through the via 51 for heat dissipation.

Figure 7:
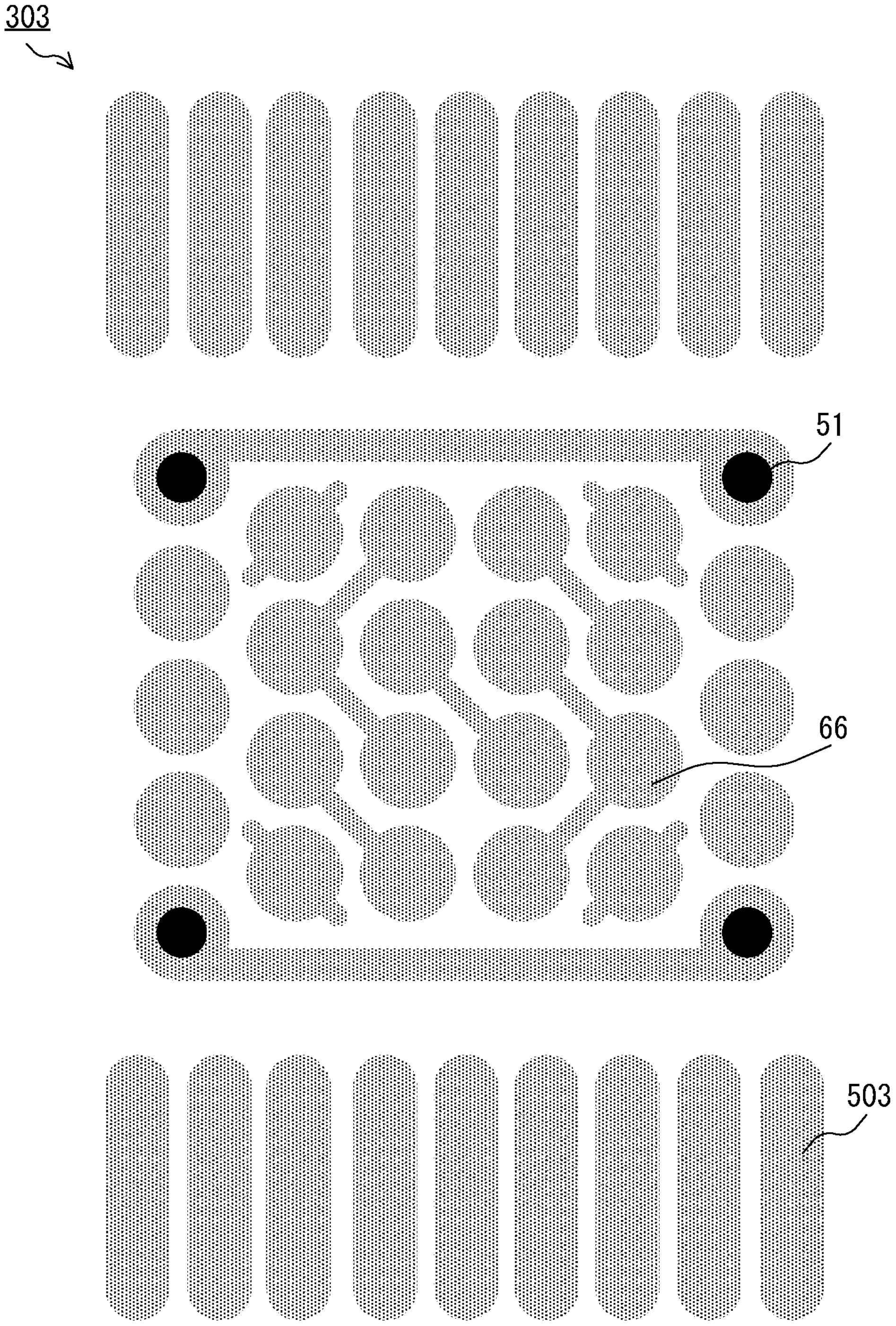
FIG. 7 is an explanatory view of a mounting region for an IC on the circuit board.

FIG. 7 is an explanatory view of a mounting region for an IC on the circuit board. Here, description is given of a case in which a lead frame is used in a semiconductor package. In the mounting region for the IC, a plurality of wiring patterns 66 for heat dissipation to which the IC is connected, and a pattern 503 for lead to which a lead of the IC is connected are provided. The vias 51 for heat dissipation are formed in the wiring patterns 66 for heat dissipation. In a case where the IC is mounted, the IC is soldered on the wiring patterns 66 for heat dissipation and the pattern 503 for lead.

A center portion of the wiring pattern 66 for heat dissipation is formed so that, in order to prevent solder from leaking from the wiring pattern 66 for heat dissipation in a case where the IC is mounted, each wiring pattern 66 for heat dissipation has the same area and the same shape (circular shape in this case). The vias 51 for heat dissipation are formed at four corners of an outer edge of the wiring patterns 66 for heat dissipation in order to prevent solder balls from being generated in a case where the IC is mounted. The vias 51 for heat dissipation may be formed at positions other than the four corners. In a case where the IC is mounted, the die pads of the IC are caused to adhere with solder to the wiring patterns 66 for heat dissipation. The die pads have a function as heat dissipation plates.

Figure 8A:
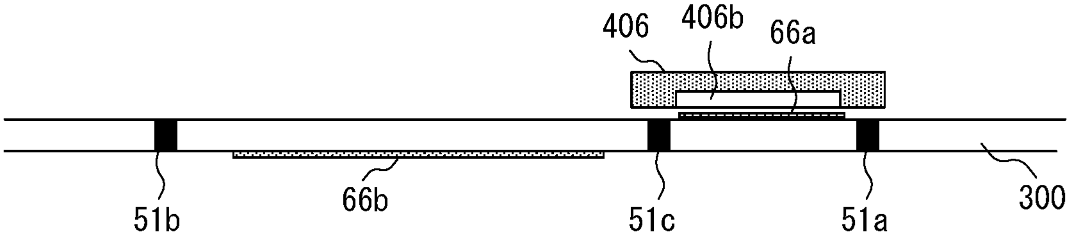
FIG. 8A, FIG. 8B, and FIG. 8C are exemplary views of a configuration of a circuit board at the time when an IC is mounted.
Figure 8B:
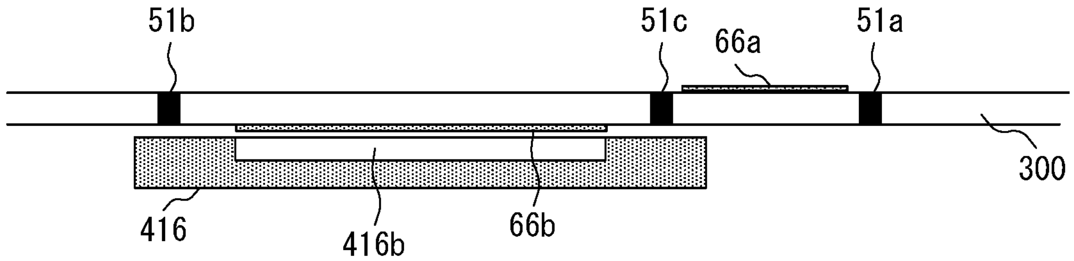
Figure 8C:
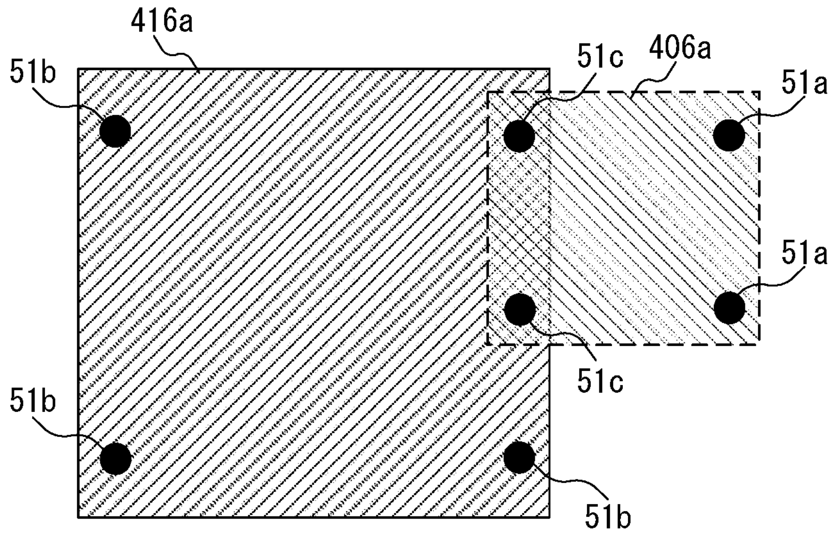

FIG. 8A to FIG. 8C are exemplary views of a configuration of the circuit board at the time when an IC is mounted in the second embodiment. As described in the first embodiment, the motor driver IC 406 and the motor driver IC 416 have different package sizes. FIG. 8A shows a case in which the motor driver IC 406 is mounted. FIG. 8B shows a case in which the motor driver IC 416 is mounted. FIG. 8A and FIG. 8B are views obtained by viewing the circuit board 300 from the lateral side. FIG. 8C is a view obtained by viewing the circuit board 300 from the first surface side (front surface side).

The mounting region 406*a* for the motor driver IC 406 and the mounting region 416*a* for the motor driver IC 416 are provided so that parts thereof overlap each other as viewed from the upper side of the first surface (front surface) (in a direction perpendicular to a surface on which the mounting region 406*a* is provided) (FIG. 8C). That is, a part including an outer edge of the mounting region 406*a* for the motor driver IC 406 overlaps the mounting region 416*a* for the motor driver IC 416, and another part of the mounting region 406*a* for the motor driver IC 406 is outside of the mounting region 416*a* for the motor driver IC 416. Further, a part including an outer edge of the mounting region 416*a* for the motor driver IC 416 overlaps the mounting region 406*a* for the motor driver IC 406, and another part of the mounting region 416*a* for the motor driver IC 416 is outside of the mounting region 406*a* for the motor driver IC 406.

The mounting region 406*a* for the motor driver IC 406 and the mounting region 416*a* for the motor driver IC 416 are provided on different surfaces opposed to each other across the circuit board 300. The motor driver IC 406 and the motor driver IC 416 have different package sizes, and hence the areas (sizes) of the respective mounting regions 406*a* and 416*a* are also different from each other. In the second embodiment, the mounting region 416*a* for the motor driver IC 416 is provided to be wider than the mounting region 406*a* for the motor driver IC 406. In the mounting region 406*a* for the motor driver IC 406, a wiring pattern 66*a* for heat dissipation on which a heat dissipation surface 406*b* of the motor driver IC 406 is to be soldered is provided. In the mounting region 416*a* for the motor driver IC 416, a wiring pattern 66*b* for heat dissipation on which a heat dissipation surface 416*b* of the motor driver IC 416 is to be soldered is provided.

Vias 51*a* for heat dissipation are through vias for the motor driver IC 406, and are formed to pass through the circuit board 300 from the first surface (front surface) on which the motor driver IC 406 is to be mounted to the second surface (back surface) on which the motor driver IC 416 is to be mounted. Vias 51*b* for heat dissipation are through vias for the motor driver IC 416, and are formed to pass through the circuit board 300 from the second surface (back surface) on which the motor driver IC 416 is to be mounted to the first surface (front surface) on which the motor driver IC 406 is to be mounted. Vias 51*c* for heat dissipation are formed in a region in which the mounting region 406*a* for the motor driver IC 406 and the mounting region 416*a* for the motor driver IC 416 overlap each other as viewed from the first surface side (front surface side), so as to pass through the circuit board 300 from the first surface (front surface) to the second surface (back surface). The vias 51*c* for heat dissipation are through vias to be shared for heat dissipation of each of the motor driver IC 406 and the motor driver IC 416.

The vias 51*a* and 51*c* for heat dissipation are used for heat dissipation of the motor driver IC 406. The vias 51*b* and 51*c* for heat dissipation are used for heat dissipation of the motor driver IC 416. The vias 51*a*, 51*b*, and 51*c* for heat dissipation are formed outside of the wiring patterns 66*a* and 66*b* for heat dissipation within the mounting regions 406*a* and 416*b*. With such a configuration, in a case where the motor driver IC 406 is mounted, the solder of the wiring pattern 66*a* for heat dissipation is prevented from leaking to the second surface (back surface) through the vias 51*a*, 51*b*, and 51*c* for heat dissipation. Further, in a case where the motor driver IC 416 is mounted, the solder of the wiring pattern 66*b* for heat dissipation is prevented from leaking to the first surface (front surface) through the vias 51*a*, 51*b*, and 51*c* for heat dissipation.

As described above, the electronic parts are exclusively mounted on the circuit board 300. With this configuration, while a part acquisition risk that occurs in procurement of an electronic part to be mounted is suppressed, the circuit board 300 can be continuously manufactured through use of a replacement product even in a case where the electronic part lacks. Further, the mounting regions for the respective electronic parts are shifted from each other as viewed from the upper side of the circuit board, thereby being capable of preventing solder balls from being generated and partially sharing the through vias for heat dissipation. Accordingly, the solder is prevented from leaking through the through via in a case where the electronic part is mounted, without losing the heat dissipation performance of the electronic part. Thus, the reduction in yield is suppressed. Moreover, a distance between the electronic parts can be set to a minimum distance that allows prevention of solder leakage, and hence increase of the area of the circuit board 300 can be suppressed.

In the second embodiment, description has been given of an example in which semiconductor devices (motor driver ICs 406 and 416) are used as the electronic parts, but the electronic parts are not limited thereto. The function of the electronic part is not limited as long as the electronic part is configured to be mounted with solder in the mounting region on the circuit board 300. For example, the electronic part may be a switching IC, an FET, or the like.

Further, description has been given of an example in which a semiconductor device (motor driver ICs 406 and 416) is used as a replacement part. However, the effect obtained by the second embodiment is not limited to such an example. For example, in some cases, the circuit board 300 is designed as a common platform with respect to a plurality of apparatus. At this time, in one model, the first electronic part having a first function is mounted in the mounting region 406*a*, while, in another model, the second electronic part having a second function different from the first function is mounted in the mounting region 416*a*. In such a case as well, the effect described in the second embodiment can be obtained.

Third Embodiment

As described in the second embodiment, there is a possibility that solder leaks from the via 51 for heat dissipation in a case where the electronic part is soldered. Such leakage of the solder causes shortage of a solder amount between the electronic part and the mounting region. With the shortage of the solder amount, there is a possibility that a solder amount required for mounting of the electronic part cannot be ensured. This situation causes insufficient strength for mounting the electronic part on the circuit board. In a case where the electronic part is mounted on the circuit board at an insufficient strength, the yield of the circuit board is reduced, and thus the yield of the apparatus on which this circuit board is mounted is reduced.

On the circuit board, ICs are exclusively mounted on the first surface (front surface) and the second surface (back surface) different from the first surface. In the mounting region for the IC (hereinafter referred to as "first IC") on the first surface, a heat transfer pattern for conducting heat from the die pad is formed. In the mounting region for the IC (hereinafter referred to as "second IC") on the second surface, a heat transfer pattern for conducting heat from the die pad is formed. For example, the first IC is a genuine product, and the second IC is a replacement product. In light of correspondence to the first embodiment and the second embodiment, the first IC is the motor driver IC 406, and the second IC is the motor driver IC 416.

In a third embodiment of the present disclosure, description is given of a case in which the size of the first IC is smaller than the size of the second IC. An area of the mounting region (heat transfer pattern) for the first IC to be provided on the first surface is smaller than an area of the mounting region (heat transfer pattern) for the second IC to be provided on the second surface. In a case where the circuit board is viewed from the first surface direction (direction perpendicular to the first surface), the mounting region (heat transfer pattern) for the first IC is included in the mounting region (heat transfer pattern) for the second IC. Vias for heat dissipation are formed in the heat transfer pattern. A part of the plurality of vias for heat dissipation is formed in a region (overlapping region) in which the mounting region (heat transfer pattern) for the first IC and the mounting region (heat transfer pattern) for the second IC overlap each other as viewed from the first surface direction (direction perpendicular to the first surface). In this manner, the board area is reduced, and a part of the vias for heat dissipation is shared by the first IC and the second IC.

Figure 9:
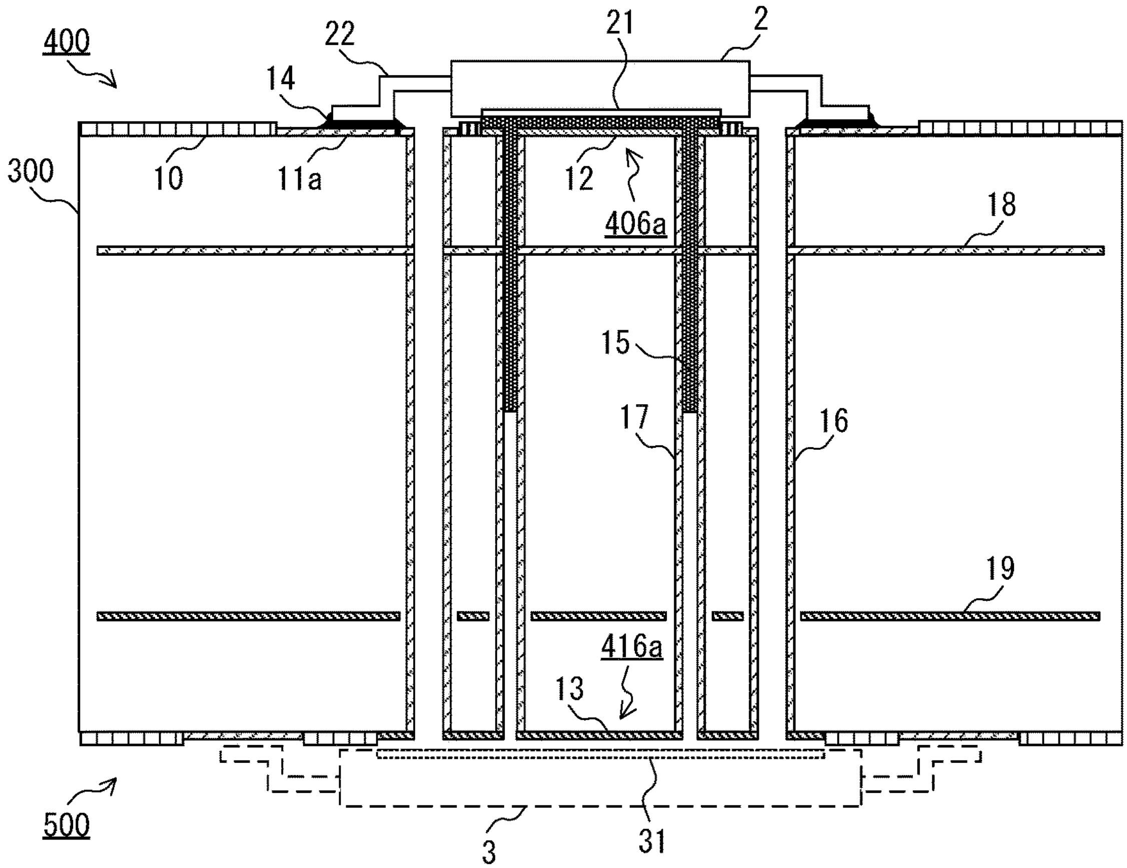
FIG. 9 is an exemplary view of a configuration of the circuit board.

FIG. 9 is an exemplary view of a configuration of the circuit board of the third embodiment. In FIG. 9, a first surface 400 of the circuit board 300 is on the upper side. A first IC 2 on the first surface 400 and a second IC 3 on a second surface 500 are exclusively mounted on the circuit board 300. FIG. 9 shows a state in which the first IC 2 is mounted, and the second IC 3 is indicated by dotted lines. The first IC 2 includes a die pad 21, and the second IC 3 includes a die pad 31.

The first IC 2 and the second IC 3 are ICs having the same function. For example, the first IC 2 and the second IC 3 are ICs having a large heat generation amount. As ICs having a large heat generation amount, there are a DC-DC converter IC and the like in addition to the motor driver IC described in the first embodiment and the second embodiment. Accordingly, the first IC 2 and the second IC 3 are formed of packages including the die pads 21 and 31 and having high heat dissipation performance.

In the third embodiment, from the viewpoint of part procurement, the first IC 2 and the second IC 3 have different sizes. Description is given here of a case in which the first IC 2 has a smaller size. The size of the die pad corresponds to the size of the IC. Accordingly, the die pad 21 has a size smaller than that of the die pad 31. For example, the first IC 2 is formed of a package of thin-shrink small outline package (TSSOP)-14. The second IC 3 is formed of a package of small outline package (SOP)-8. The packages of the ICs may be packages of other types as long as the packages include die pads.

Figure 10:
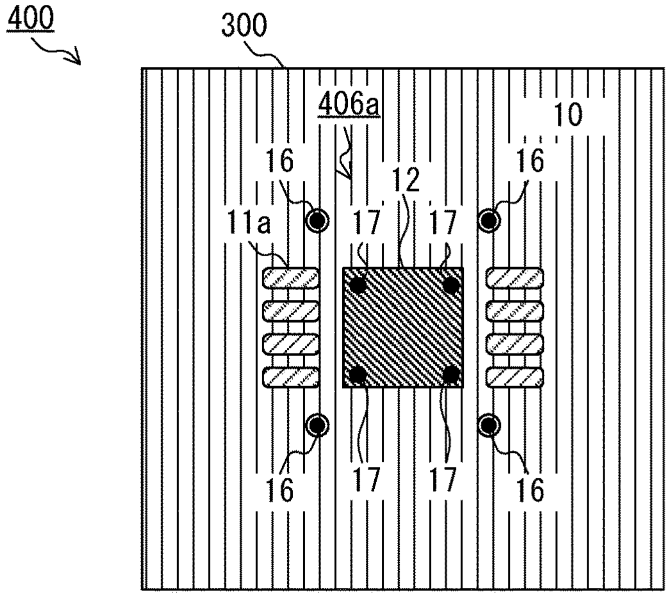
FIG. 10 is an exemplary view of a wiring pattern on a first surface side of the circuit board.
Figure 11:
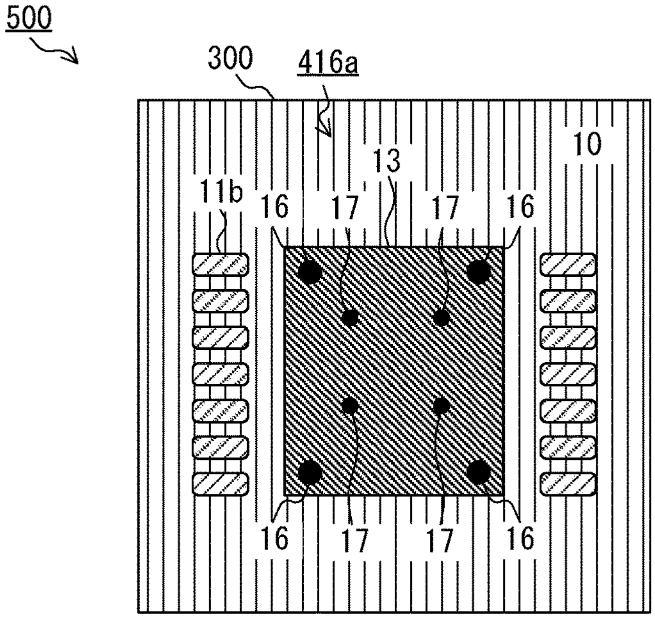
FIG. 11 is an exemplary view of a wiring pattern on a second surface side of the circuit board.
Figure 12:
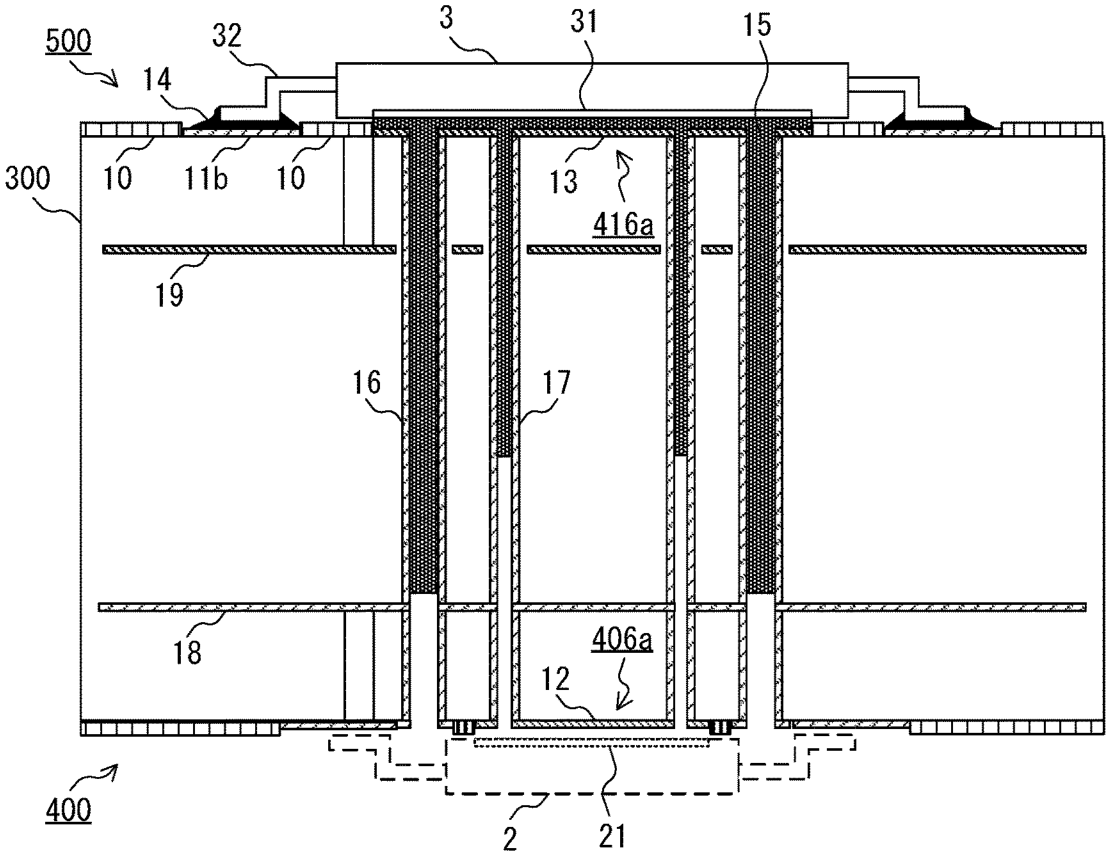
FIG. 12 is an exemplary view of a configuration of the circuit board.

The circuit board 300 is a circuit board having a multilayer structure. In the third embodiment, the circuit board 300 has a four-layer configuration made of a general flame retardant (FR material) having a thickness of 1.6 mm, but the number of layers is not limited thereto. FIG. 10 is an exemplary view of a wiring pattern on the first surface side of the circuit board 300 on which the first IC 2 is to be mounted. FIG. 11 is an exemplary view of a wiring pattern on the second surface side of the circuit board 300 on which the second IC 3 is to be mounted. FIG. 12 is an exemplary view of a configuration of the circuit board 300, in which the second surface side is the upper side.

On each of the first surface 400 and the second surface 500, a solder resist 10 is applied. On the solder resist 10 of the first surface 400, a land 11*a* for lead connection and a heat transfer pattern 12 are provided. A lead electrode 22 of the first IC 2 can be connected to the land 11*a* for lead connection, and the die pad 21 of the first IC 2 can be caused to adhere to the heat transfer pattern 12. The heat transfer pattern 12 corresponds to the wiring pattern 66*a* for heat dissipation in the first embodiment and the second embodiment. A region in which the land 11*a* for lead connection and the heat transfer pattern 12 are formed corresponds to the mounting region 406*a* for the first IC 2. On the solder resist 10 of the second surface 500, a land 11*b* for lead connection and a heat transfer pattern 13 are provided. A lead electrode 32 of the second IC 3 can be connected to the land 11*b* for lead connection, and the die pad 31 of the second IC 3 can be caused to adhere to the heat transfer pattern 13. The heat transfer pattern 13 corresponds to the wiring pattern 66*b* for heat dissipation in the first embodiment and the second embodiment. A region in which the land 11*b* for lead connection and the heat transfer pattern 13 are formed corresponds to the mounting region 416*a* for the second IC 3.

The land 11*a* for lead connection is connected (soldered) to the lead electrode 22 of the first IC 2 with solder 14 in a case where a solder paste melts at the time of reflow. The land 11*b* for lead connection is similarly connected (soldered) to the lead electrode 32 of the second IC 3 with the solder 14 in a case where the solder paste melts at the time of reflow.

The heat transfer pattern 12 and the heat transfer pattern 13 each have a rectangular shape, and are formed in accordance with the sizes and the shapes of the first IC 2 and the second IC 3 to be mounted thereon. In this case, the first IC 2 has a size smaller than that of the second IC 3, and hence the heat transfer pattern 12 has a size smaller than that of the heat transfer pattern 13. For the first IC 2 and the second IC 3, the mounting region 406*a* and the mounting region 416*a* are provided at positions opposed to each other across the circuit board 300. Accordingly, as viewed from the first surface side (direction perpendicular to the first surface), the region of the heat transfer pattern 12 is included in the region of the heat transfer pattern 13.

In the heat transfer pattern 12, a plurality of vias 17 for heat dissipation are formed. In the heat transfer pattern 13, a plurality of vias 16 and 17 for heat dissipation are formed. The plurality of vias 17 for heat dissipation are formed at four corners of the rectangular shape of the heat transfer pattern 12. The plurality of vias 16 for heat dissipation are formed at four corners of the rectangular shape of the heat transfer pattern 13. That is, the plurality of vias 17 for heat dissipation are formed in an overlapping region in which the heat transfer pattern 12 and the heat transfer pattern 13 overlap each other as viewed from the first surface side (direction perpendicular to the first surface), and are shared for heat dissipation of the first IC 2 and the second IC 3. The vias 16 for heat dissipation are formed in a region in which the heat transfer pattern 13 and the heat transfer pattern 12 do not overlap each other as viewed from the first surface side (direction perpendicular to the first surface), and are used for heat dissipation of the second IC 3. In such a configuration, the vias 17 for heat dissipation pass through the heat transfer pattern 12 and the heat transfer pattern 13. The vias 16 for heat dissipation pass through the heat transfer pattern 13 and the first surface 400 outside of the heat transfer pattern 12.

In a case where the plurality of vias 16 and 17 for heat dissipation are thus formed, as described above, a large amount of solder may flow into the vias 16 and 17 for heat dissipation due to heating processing at the time in a case where the IC is mounted, depending on the arrangements of the vias 16 and 17 for heat dissipation. Accordingly, in the third embodiment, the following configuration is proposed.

In a case where the solder paste applied to the heat transfer pattern 12 melts at the time of reflow, molten solder 15 flows into a plurality of vias 17 for heat dissipation (see FIG. 9). At this time, a gap (stand-off) between the first IC 2 (die pad 21) and the heat transfer pattern 12 is determined based on the package standard. In the third embodiment, for example, the gap between the first IC 2 (die pad 21) and the heat transfer pattern 12 is 0 mm at minimum and 0.152 mm at maximum. Similarly, the gap between the second IC 3 (die pad 31) and the heat transfer pattern 13 is 0 mm at minimum and 0.150 mm at maximum.

The via 16 for heat dissipation and the via 17 for heat dissipation have different sizes. That is, the via 16 for heat dissipation and the via 17 for heat dissipation have different opening areas. In the third embodiment, the via 17 for heat dissipation is formed to have a size smaller than the size (opening area) of the via 16 for heat dissipation. For example, the via 16 for heat dissipation is a through via having a diameter of 0.3 mm, and the via 17 for heat dissipation is a through via having a diameter of 0.25 mm. The via 16 for heat dissipation and the via 17 for heat dissipation are each plated on its inner side at a thickness of 15 μm. That is, in a case where the heat transfer pattern 12 is viewed from the first surface side (direction perpendicular to the first surface), the vias 16 for heat dissipation having a relatively large diameter are formed in a region not overlapping the heat transfer pattern 12, and the vias 17 for heat dissipation having a relatively small diameter are formed in the overlapping region overlapping the heat transfer pattern 12.

As illustrated in FIG. 9 and FIG. 12, the second layer of the circuit board 300 is the ground layer, and has copper foil 18 provided for supplying a ground voltage. The third layer is the power supply layer, and has a power supply pattern 19 provided for supplying a power supply voltage. Heat conducted through the vias 16 and 17 for heat dissipation is dissipated to other layers (second layer and third layer).

In general double-sided reflow mounting to the circuit board 300, small electronic parts, such as chip resistors and chip capacitors, are mounted in the first reflow step. In the second reflow step, large electronic parts, such as ICs and electrolytic capacitors having a high height, are mounted. This operation is performed in order to prevent the electronic parts mounted in the first reflow step from falling by their own weights in a case where the solder melts by heating performed in the second reflow step. A surface on which the electronic parts are mounted in the first reflow step is referred to as "primary surface," and a surface on which the electronic parts are mounted in the second reflow step is referred to as "secondary surface."

Now, a method of mounting an IC onto the primary surface and the secondary surface is described in detail. In the third embodiment, the second IC 3 has a size larger than that of the first IC 2, and hence the second IC 3 has a larger weight. Accordingly, in the first reflow step, reflow is performed with the first surface 400 being used as the primary surface, and, in the second reflow step, reflow is performed with the second surface 500 being used as the secondary surface.

<In a Case where Second IC 3 is Mounted on Secondary Surface and First IC 2 is Unmounted>

As described above, the second IC 3 is mounted on the secondary surface (second surface 500) in the second reflow step.

Figure 13:
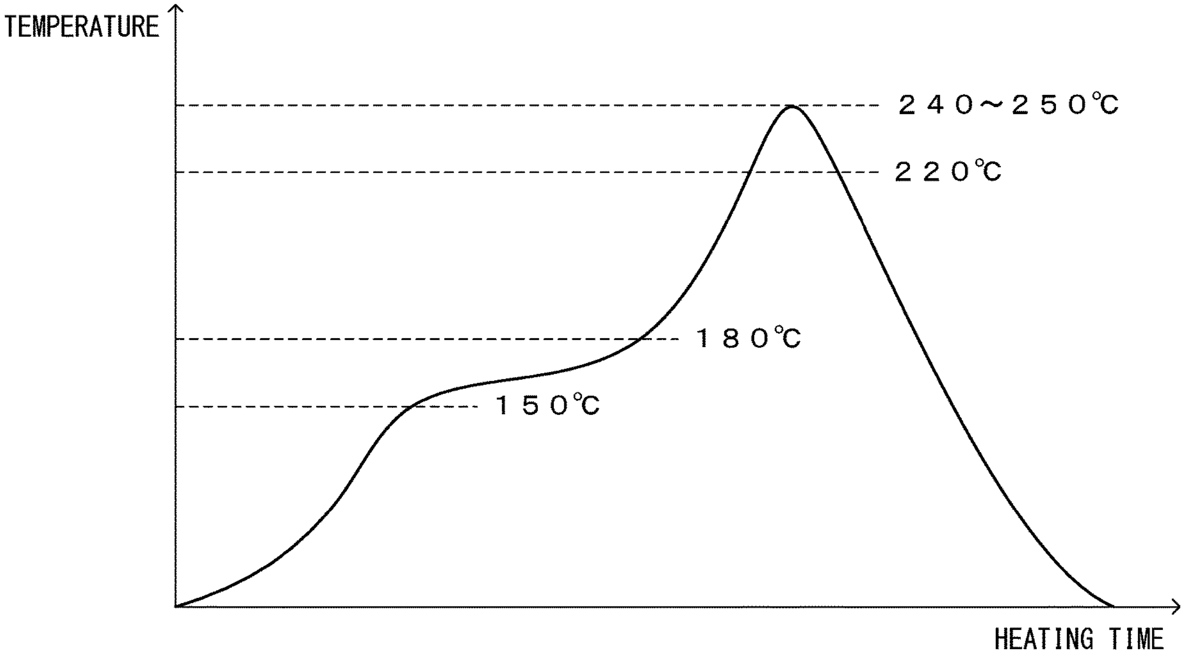
FIG. 13 is an exemplary graph of a reflow temperature profile.

FIG. 13 is an exemplary graph of a general reflow temperature profile used in the reflow step. The horizontal axis represents a heating time of the reflow step, and the vertical axis represents a temperature corresponding to the heating time. A period in which the temperature is from 150° C. to 180° C. is a pre-heat period, and a period in which the temperature is 180° C. or more is a main heating period. In general, in a reflow furnace, the circuit board 300 has a temperature difference between the front surface and the inner layer thereof. For example, even in a case where the front surface of the circuit board 300 reaches 240° C. during the main heating period, the inner layer (inner side) may be 220° C.

This difference is caused because, even in a case where hot air is blown from an upper heater and a lower heater of the reflow furnace, the heat is absorbed by the inner layer of the circuit board 300 and thus the temperature is less liable to increase. In such a situation, the temperature inside of the via for heat dissipation varies between the front surface side and the inner layer side of the circuit board 300. Even in a case where the molten solder flowing into the via for heat dissipation is 240° C. on the front surface side, in a case in which the ground pattern on the inner layer side is 220° C., the inner layer side draws away the heat.

The second IC 3 is mounted in the second reflow step. Accordingly, even in a case where the solder protrudes to the primary surface side from the vias 16 for heat dissipation and the vias 17 for heat dissipation, the protruding solder does not cause a problem because the mounting of the primary surface side is ended. However, the vias 17 for heat dissipation are arranged on the inner side of the heat transfer pattern 13 with respect to the vias 16 for heat dissipation, and hence the solder is liable to protrude at the time of reflow mounting.

In the third embodiment, the vias 17 for heat dissipation each having a diameter smaller than that of each of the vias 16 for heat dissipation are arranged on the inner side of the heat transfer pattern 12 so that the protrusion of the solder from the vias 17 for heat dissipation is suppressed at the time of reflow mounting. Specifically, as described above, the diameter of the via 16 for heat dissipation is 0.3 mm, which is a normal diameter, and the diameter of the via 17 for heat dissipation is 0.25 mm, which is a small diameter. The vias 17 for heat dissipation are formed on the inner side of the heat transfer pattern 13.

In general, the diameter of the via for heat dissipation is about 0.3 mm. However, the inventors of the present disclosure have found that, even in a case of a via for heat dissipation having a diameter of 0.3 mm, in a case where the via for heat dissipation is formed inside of the heat transfer pattern such as at a center portion of the heat transfer pattern, large solder protrusion is caused at a lower portion of the via for heat dissipation, depending on the reflow profile. It is inferred that this protrusion is caused because, at the center portion of the heat transfer pattern, a solder paste is present in an amount equal to or larger than a capacity filling the inside of the via for heat dissipation, and even the via for heat dissipation having the diameter of 0.3 mm sucks up the molten solder through the capillary phenomenon. Further, in another finding, in a case of a via for heat dissipation having a diameter of 0.25 mm, even in a case where the via for heat dissipation is formed inside of the heat transfer pattern, solder protrusion did not occur at the time of reflow.

The inventors of the present disclosure infer that the inflow/protrusion of the solder does not occur in a case where the diameter of the via for heat dissipation is smaller than normal for the following three reasons.

1. The suck-up force of solder obtained by the capillary phenomenon (surface tension) becomes smaller as the diameter of the via for heat dissipation becomes smaller.
2. The pipe resistance of the molten solder serving as a viscous fluid becomes larger as the diameter of the via for heat dissipation becomes smaller.
3. The quantity of heat held by the molten solder flowing into the via for heat dissipation becomes smaller and the temperature is thus more likely to decrease as the diameter of the via for heat dissipation becomes smaller. In this case, in a case where the temperature decreases, there is added a secondary effect that the surface tension further decreases and the viscosity increases to further increase the pipe resistance.

It is considered that, because of the three reasons described above, although solder protrusion occurs in the via for heat dissipation having the diameter of 0.3 mm, solder protrusion is reduced in the via for heat dissipation having the diameter of 0.25 mm. The mechanical basis of each of the three reasons described above is described below.

1. The capillary phenomenon (surface tension) becomes smaller as the diameter of the via for heat dissipation becomes smaller.

When a diameter, a contact angle, and surface tension are represented by “d”, “0”, and S, respectively, a vertical-direction component F of the surface tension caused by the capillary phenomenon is expressed by (Equation 1) below.

$$F = \pi d S \cos\theta \quad \text{(Equation 1)}$$

The vertical-direction component F of the surface tension acts as a force of accelerating the molten solder having a mass “m” flowing inside of the via for heat dissipation. It is understood from (Equation 1) that the vertical-direction component F of the surface tension is in proportion to the diameter “d” of the via for heat dissipation. Accordingly, in a case where the diameter of the via for heat dissipation is small, the solder suck-up force is decreased.

2. The pipe resistance of the molten solder serving as the viscous fluid becomes larger as the diameter of the via for heat dissipation becomes smaller.

In a case where the molten solder flowing into the via for heat dissipation is regarded as a viscous fluid (viscous liquid), a pipe resistance is caused with the via for heat dissipation being regarded as a pipe. The pipe resistance acts as a force of decelerating the molten solder flowing inside of the via for heat dissipation. The viscosity and the specific gravity of the molten solder are represented by “u” and “p”, respectively, the via for heat dissipation is regarded as a pipe having a diameter of “d” and a length of L, and the molten solder is regarded as a Newtonian fluid. In this case, a pipe resistance P at the time of a pipe friction coefficient “A”, a molten solder density “p”, and a flow velocity “v” inside the pipe is expressed by (Equation 2) below.

$$P = \lambda \cdot (L/d) \cdot (pv^2) \quad \text{(Equation 2)}$$

In this case, a relationship between the pipe friction coefficient “A” and a Reynolds number Re is expressed by (Equation 3) below.

$$\lambda = 64/Re \quad \text{(Equation 3)}$$

A relationship among the Reynolds number Re, a dynamic viscosity “v”, the viscosity “μ”, the density “ρ”, and the diameter “d” of the via for heat dissipation is expressed by (Equation 4) below.

$$Re = (v \cdot d \cdot \rho)/(\mu \times 10^{-3}) \quad \text{(Equation 4)}$$

From (Equation 2) to (Equation 4) above, the pipe resistance P is expressed by (Equation 5) below.

$$P = (64/(v \cdot d \cdot \rho)/(\mu \times 10^{-3})) \cdot (L/d) \cdot (pv^2/2) = (32 \cdot \mu \times 10^{-3} \cdot L \cdot v)/d^2 \quad \text{(Equation 5)}$$

It is understood from (Equation 5) that the pipe resistance P is in inverse proportion to the square of the diameter “d” of the via for heat dissipation. That is, the pipe resistance P becomes larger as the diameter “d” of the via for heat dissipation becomes smaller.

3. The quantity of heat held by the molten solder flowing into the via for heat dissipation becomes smaller and the temperature is thus more likely to decrease as the diameter of the via for heat dissipation becomes smaller.

While the molten solder flows into the via for heat dissipation, heat transfers to the second layer (GND layer) which has a high specific heat and to which the via for heat dissipation is connected, and thus the temperature gradually decreases. When it is assumed that molten solder that has flowed into the via for heat dissipation, which has a diameter of “d” and a unit height of ΔL, has a quantity of heat, the quantity of heat is simply in proportion to the volume of the solder. A quantity Q of heat is expressed by (Equation 6) below.

$$Q = \pi (d \cdot 2)^2 \cdot \Delta L \quad \text{(Equation 6)}$$

Thus, the quantity Q of heat is in proportion to the square of the diameter “d” of the via for heat dissipation. That is, the quantity of heat held by the molten solder becomes smaller as the diameter of the via for heat dissipation becomes smaller. This quantity Q of heat is conducted to the copper foil 18 of the second layer (GND layer) while the molten solder flows into the via for heat dissipation. Accordingly, it is assumed that the temperature of the molten solder is gradually decreased.

The decrease in temperature of the molten solder affects the contact angle “θ” of the surface tension. For example, in a case where the solder is Sn-3Ag-0.5Cu and the temperature is 238° C., the surface tension T is 0.44 N/m and the contact angle “θ” is 65°. Surface tension tends to decrease as the temperature becomes higher. The change of the contact angle “θ” decreases as the temperature becomes higher. In a case where the temperature of the solder is 258° C., the contact angle “θ” is 59°. That is, the contact angle “0” becomes larger as the temperature becomes lower. Thus, in a case where the molten solder is cooled and its temperature is decreased while flowing through the via for heat dissipation, the contact angle “θ” is increased, and the vertical-direction component F of the surface tension is decreased.

Further, the decrease in temperature affects the viscosity “μ” of the molten solder regarding the pipe resistance P. The viscosity “μ” of the molten solder becomes the following values in a temperature range of from about 490 K to about 560 K in the case of, for example, solder of Sn-3Ag-0.5Cu.

At the time of 495 K (=220.85° C.), viscosity $\mu$=1.65 mPa·s

At the time of 520 K (=246.85° C.), viscosity $\mu$=1.62 mPa·s

At the time of 550 K (–276.85° C.), viscosity $\mu$=1.5 mPa·s

That is, the solder has a higher viscosity as the temperature becomes lower. From (Equation 5) above, the pipe resistance P is in proportion to the viscosity "$\mu$", and hence the pipe resistance P becomes larger as the solder temperature becomes lower. Thus, in a case where the molten solder is cooled and its temperature is decreased while flowing through the via for heat dissipation, the solder viscosity "$\mu$" is increased, and the pipe resistance P is increased.

Figure 14:
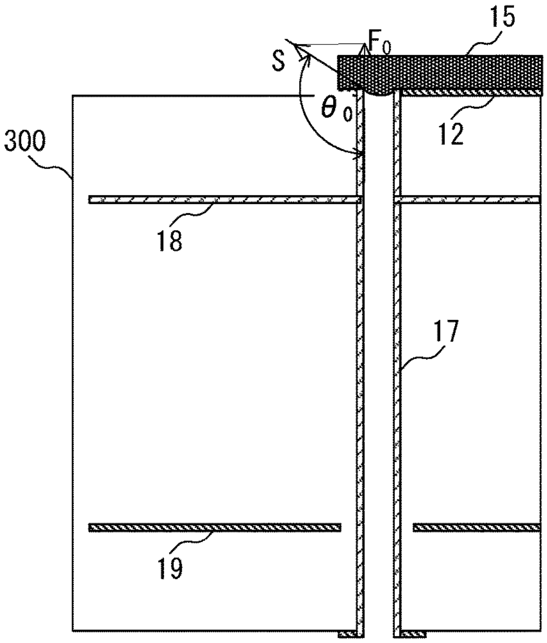
FIG. 14 is an explanatory view of a process in which a solder paste flows into a thermal via.
Figure 15:
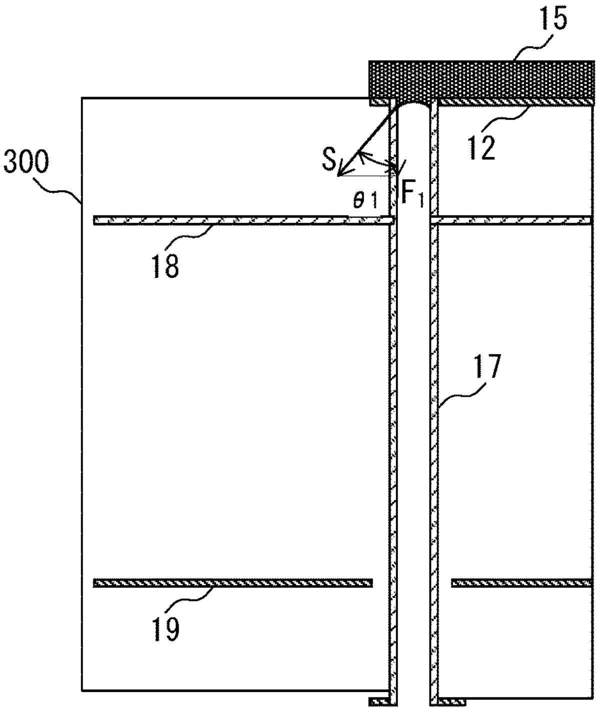
FIG. 15 is an explanatory view of the process in which the solder paste flows into the thermal via.
Figure 16:
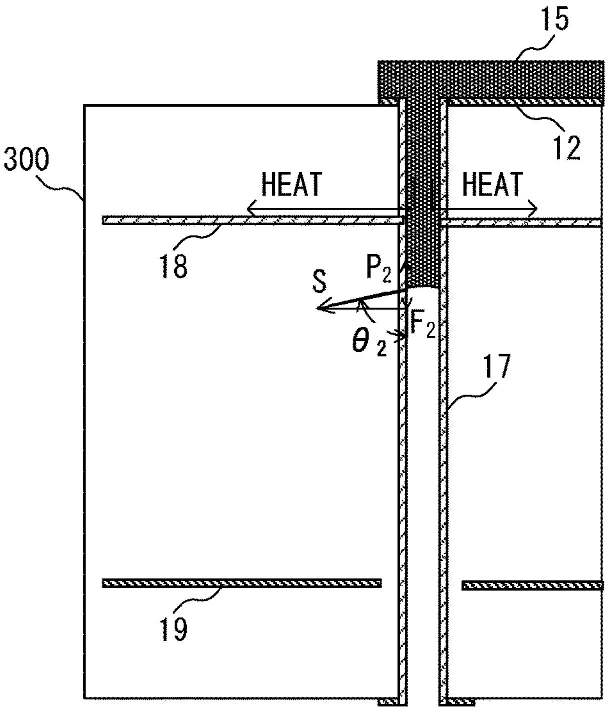
FIG. 16 is an explanatory view of the process in which the solder paste flows into the thermal via.

From the facts described above, it is inferred that, at the time of temperature rise caused by reflow, the solder paste near the via for heat dissipation flows into the via for heat dissipation in the following process. FIG. 14 to FIG. 16 are explanatory views of the process in which the solder paste flows into the via 17 for heat dissipation.

(1) At normal temperature (25° C.), a lead-free solder paste (general solder paste of Sn-3.0Ag-0.5Cu) is applied to the heat transfer pattern 12.

(2) Reflow is started so that, in the pre-heat period (150° C. to 180° C.), flux in the solder paste (having a main component of abietic acid ($C_{19}H_{29}COOH$) and a melting point of 174° C.) melts.

(3) The molten flux flows into the via 17 for heat dissipation due to the capillary phenomenon and penetrates through the plated layer inside of the via 17 for heat dissipation, to thereby decrease the contact angle $\theta$ inside of the via for heat dissipation. Further, part of the flux is vaporized and evaporated.

(4) In the main heating period (180° C. to 220° C.), on the reflow upper surface side, the solder exceeds a liquid phase temperature (219° C.) to melt. The molten solder does not flow into the via 17 for heat dissipation by a vertical component $F_0$ of the surface tension at the time of a contact angle $\theta_0 \geq 90°$ (FIG. 14). In a case where the solder temperature rises due to heating to satisfy a contact angle $\theta_1 < 90°$, the solder starts to flow into the via 17 for heat dissipation by a vertical component $F_1$ of the surface tension due to the capillary phenomenon (FIG. 15).

(5) The molten solder that has flowed into the via 17 for heat dissipation has the quantity Q of heat, but the heat is conducted to the second layer (GND layer) connected to the via 17 for heat dissipation in the inner layer of the circuit board 300 so that the temperature is decreased. The decrease in temperature of the solder that has flowed into the via 17 for heat dissipation causes increase in contact angle $\theta$ ($\theta_1 \rightarrow \theta_2$) and decrease in surface tension (FIG. 16).

Further, in a case where the molten solder is regarded as a viscous fluid, the molten solder that has flowed into the pipe of the via 17 for heat dissipation has the pipe resistance P. The decrease in temperature of the molten solder causes increase in viscosity and also increase in pipe resistance. In a case where the surface tension and the pipe resistance are balanced, the acceleration becomes 0 (motion of uniform velocity), and the molten solder does not accelerate any more. In a case where solder further flows into the via 17 for heat dissipation and its temperature is decreased, the surface tension becomes smaller than the pipe resistance. In this case, the acceleration becomes negative, and an inflow velocity decreases. The inflow stops in a case where an inflow velocity "v" becomes 0. Further, in a case where the temperature of the molten solder becomes a solid-phase temperature (217° C.) or less due to the temperature decrease, the molten solder is solidified to have no flowability.

In Item (5) above, in a case where the inflow velocity "v" is positive even at the lowermost portion of the via 17 for heat dissipation, the molten solder protrudes from the lower portion of the via 17 for heat dissipation. Meanwhile, in Item (5), in a case where the inflow velocity "v" becomes 0 before the molten solder reaches the lowermost portion inside of the via 17 for heat dissipation, the solder does not protrude from the lower portion of the via 17 for heat dissipation.

As described above, a condition for preventing the solder from protruding from the via 17 for heat dissipation resides in that the inflow velocity "v" of the molten solder becomes 0 before the molten solder reaches the lowermost portion inside of the via 17 for heat dissipation. The inventors of the present disclosure have found the condition for preventing the solder from protruding as described above by setting the diameter of the via for heat dissipation to be equal to or smaller than 0.25 mm, which is a diameter smaller than normal, without changing the reflow temperature profile from the related-art profile.

<In a Case where First IC 2 is Mounted on Primary Surface, and Second IC 3 is Unmounted>

The first IC 2 is mounted on the primary surface (first surface 400) in the first reflow step (see FIG. 9). In a case where the solder protrudes to the secondary surface from the via 17 for heat dissipation in the first reflow step, a squeegee may be caught in a step of applying a solder paste to the secondary surface, and thus there is a possibility that the quality of the surface on which the solder paste is applied is reduced. However, in the third embodiment, the diameter of the via 17 for heat dissipation is set to be equal to or smaller than 0.25 mm, which is a diameter smaller than normal, and hence the protrusion of the solder to the secondary surface is suppressed. Accordingly, no reduction in quality of the surface on which the solder paste is applied is caused, and hence reduction in yield of the circuit board due to the solder flowing into the via 17 for heat dissipation can be suppressed.

Modification Example 1

Figure 17:
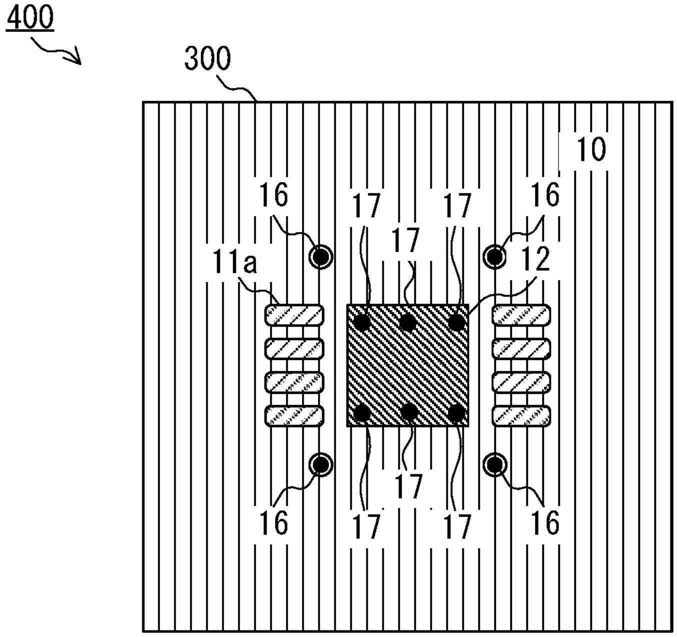
FIG. 17 is an exemplary view of a wiring pattern on the first surface side.

In the above-mentioned example, description has been given of an example in which the diameter of the via 17 for heat dissipation on the inner side of the heat transfer pattern 12 for the first IC 2 is set to be smaller than that of a normal through via. However, reduction in diameter of the via 17 for heat dissipation also causes reduction in efficiency of heat dissipation. Accordingly, in Modification Example 1, the number of vias 17 for heat dissipation formed in the heat transfer pattern 12 is increased as compared to that in the above-mentioned example. FIG. 17 is an exemplary view of a wiring pattern on the first surface side in a case in which the number of vias 17 for heat dissipation each having a diameter smaller than normal is increased by two as compared to the case of FIG. 10, along two sides of the heat transfer pattern 12. With the number of the vias 17 for heat dissipation being increased, the heat dissipation efficiency that has been reduced because of the decrease in diameter can be increased.

Modification Example 2

Figure 18:
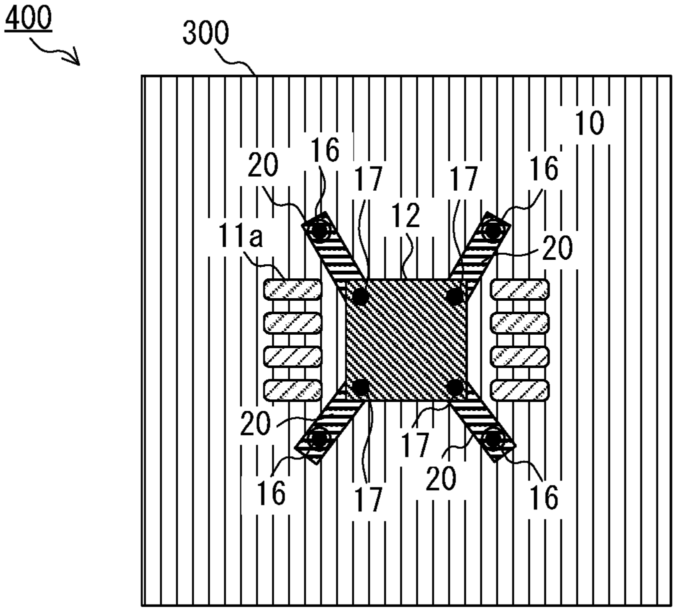
FIG. 18 is an exemplary view of a wiring pattern on the first surface side.

In Modification Example 2, the first IC 2 is also configured to use the vias 16 for heat dissipation which are formed in a normal size, for heat dissipation. FIG. 18 is an exemplary view of a wiring pattern on the first surface side in a case in which the vias 16 for heat dissipation and the heat transfer pattern 12 are connected to each other. The vias 16 for heat dissipation and the heat transfer pattern 12 are connected to each other by heat dissipation paths 20. The vias 16 for heat dissipation are separated away from the heat transfer pattern 12, and hence the heat dissipation performance itself is reduced, but the vias 16 for heat dissipation can be used for heat dissipation of heat conducted through the heat dissipation paths 20.

In a case where the heat dissipation paths 20 are simply provided, there is a possibility that the molten solder flows into the via 16 for heat dissipation via the heat dissipation path 20 so that the solder protrudes to the secondary surface side. Accordingly, the heat dissipation paths 20 may be covered with the solder resist 10. It is preferred that the solder resist 10 cover a part of the first surface 400 other than the heat transfer pattern 12 and the land 11*a* for lead connection.

Modification Example 3

Figure 19:
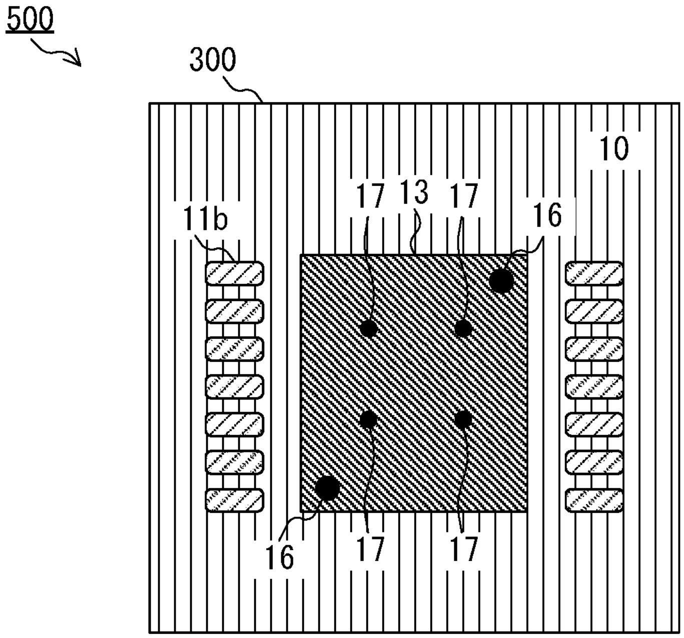
FIG. 19 is an exemplary view of a wiring pattern on the second surface side.

In each of the above-mentioned examples, the number of vias 16 for heat dissipation is four. In a case where the vias 17 for heat dissipation are formed on the inner side of the heat transfer pattern 13, the heat dissipation amount may become large relative to the heat generation amount in a case where the number of vias 16 for heat dissipation is four because the vias 17 for heat dissipation also exhibit heat dissipation. Accordingly, the number of vias 16 for heat dissipation may be reduced to achieve a heat dissipation amount corresponding to the heat generation amount. FIG. 19 is an exemplary view of a wiring pattern on the second surface side in a case in which the number of vias 16 for heat dissipation is reduced. In FIG. 19, the number of vias 16 for heat dissipation is reduced by two, and there are two vias 16 for heat dissipation at two corners of the heat transfer pattern 13.

As described above, the third embodiment has a feature in the through vias (vias 16 and 17 for heat dissipation) formed in the heat transfer patterns 12 and 13 to which the electronic parts (first IC 2 and second IC 3) are caused to adhere. Specifically, the two electronic parts to be exclusively mounted on the front and back surfaces of the circuit board 300 have different sizes. The size of the through via (via 17 for heat dissipation) formed in the mounting region (heat transfer pattern 12) for the electronic part having a smaller size is set to be smaller than the size of the through via (via 16 for heat dissipation) formed outside of this mounting region (heat transfer pattern 12).

With such a configuration, the molten solder is prevented from flowing into the through via to reach the opposite surface at the time when the electronic part is mounted. Accordingly, a sufficient amount of solder for mounting the electronic part can be ensured, and the electronic part can be mounted with a sufficient strength. In this manner, the yield of the circuit board 300 can be prevented from being reduced. Further, a similar effect can be obtained even in a case where the size of the via 51*c* for heat dissipation in the second embodiment is set to be smaller than the sizes of the vias 51*a* and 51*b* for heat dissipation.

In the third embodiment, description has been given of an example in which the first IC 2 and the second IC 3 are replacement parts. However, the effect to be obtained by the third embodiment is not limited to such an example. For example, in some cases, the circuit board 300 is designed as a common platform with respect to a plurality of apparatus. At this time, in one model, the first electronic part having a first function is mounted on the first surface, while, in another model, the second electronic part different from the first electronic part is mounted on the second surface. In such a case as well, the effect described in the third embodiment can be obtained.

As described above, the first embodiment to the third embodiment can provide a circuit board whose size is minimized, in which a replacement product can be used to implement the same function, without losing the heat dissipation performance of the electronic part.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2023-029257, filed Feb. 28, 2023 and No. 2023-130008, filed Aug. 9, 2023, which are hereby incorporated by reference herein in their entirety.

What is claimed is:

1. A circuit board comprising:

a first surface including a first region in which a first integrated circuit is mountable; and a second surface including a second region in which a second integrated circuit different from the first integrated circuit is mountable, wherein the first region of the first surface and the second region of the second surface are provided at positions opposed to each other across the circuit board, and wherein the circuit board has a via for heat dissipation, to be shared for heat dissipation of the first integrated circuit and the second integrated circuit, formed therein to connect the first region and the second region to each other.

2. The circuit board according to claim 1, wherein the via for heat dissipation is formed in a region in which one of the first integrated circuit or the second integrated circuit having a smaller package is to be mounted.

3. The circuit board according to claim 2, wherein the first integrated circuit and the second integrated circuit are each mounted on a die pad, and wherein the via for heat dissipation is configured to come into contact with the die pad of the first integrated circuit and the die pad of the second integrated circuit.

4. The circuit board according to claim 3, wherein the first surface has a first wiring pattern provided to come into contact with the die pad of the first integrated circuit, wherein the second surface has a second wiring pattern provided to come into contact with the die pad of the second integrated circuit, and wherein the via for heat dissipation is configured to come into contact with the die pad of the first integrated circuit through intermediation of the first wiring pattern, and come into contact with the die pad of the second integrated circuit through intermediation of the second wiring pattern.

5. The circuit board according to claim 4, wherein the first wiring pattern is formed to come into contact with an entire surface of the die pad of the first integrated circuit, and wherein the second wiring pattern is formed to come into contact with an entire surface of the die pad of the second integrated circuit.

6. The circuit board according to claim 5, wherein the circuit board has a multilayer structure, wherein the first surface and the second surface are outermost layers of the multilayer structure, and wherein the via for heat dissipation passes through the circuit board from the first surface to the second surface.

7. The circuit board according to claim 6, wherein, on the first surface, a first motor driver configured to drive a motor is mountable as the first integrated circuit, and wherein, on the second surface, a second motor driver configured to drive the motor is mountable as the second integrated circuit.

8. A circuit board comprising:

a first surface including a first region in which a first integrated circuit is mountable;

a second surface including a second region in which a second integrated circuit different from the first integrated circuit is mountable; and a via connecting the first region and the second region to each other, the via to be shared for heat dissipation of the first integrated circuit and the second integrated circuit, wherein, as viewed in a direction perpendicular to the first surface, a first part of the first region including an outer edge of the first region, overlaps with the second region, and a second part of the first region is outside of the second region, wherein, as viewed in the direction, a first part of the second region including an outer edge of the second region overlaps with the first region, and a second part of the second region is outside of the first region, and wherein the via is formed in an overlapping region in which the first region and the second region overlap with each other as viewed in the direction.

9. The circuit board according to claim 8, wherein a first through via that passes through the circuit board is formed in the second part of the first region, which is outside of the second region as viewed in the direction, and wherein a second through via that passes through the circuit board is formed in a part of the second region, which is outside of the first region as viewed in the direction.

10. The circuit board according to claim 9, wherein the first surface has a first wiring pattern provided to come into contact with a heat dissipation plate of the first integrated circuit, wherein the second surface has a second wiring pattern provided to come into contact with a heat dissipation plate of the second integrated circuit, wherein the via for heat dissipation, the first through via, and the second through via are formed outside of the first wiring pattern, and wherein the via for heat dissipation, the first through via, and the second through via are formed outside of the second wiring pattern.

11. The circuit board according to claim 1, wherein the circuit board includes an overlapping region in which, as viewed in a direction perpendicular to the first surface, the first region and the second region overlap with each other, and wherein the via for heat dissipation includes a first through via arranged in the overlapping region, and a second through via having an opening area different from an opening area of the first through via.

12. The circuit board according to claim 11, wherein an area of the first region is smaller than an area of the second region, and wherein the first through via is formed in a region in which the first region and the second region overlap each other as viewed from the direction, and has an opening area smaller than the opening area of the second through via.

13. The circuit board according to claim 12, wherein the second through via is formed in, in the second region, a region in which the first region and the second region do not overlap each other as viewed from the direction.

14. The circuit board according to claim 1, wherein the first integrated circuit has been mounted in the first region, and at least a part of the second region has no part mounted therein.

15. An image forming apparatus comprising:

a circuit board including:

a first surface including a first region in which a first integrated circuit is mountable; and a second surface including a second region in which a second integrated circuit different from the first integrated circuit is mountable; and a constituent part to be controlled by any of the first integrated circuit or the second integrated circuit mounted on the circuit board to form an image, wherein the circuit board is configured such that:

the first region of the first surface and the second region of the second surface are provided at positions opposed to each other across the circuit board; and a via for heat dissipation to be shared for heat dissipation of the first integrated circuit and the second integrated circuit is formed to connect the first region and the second region to each other.

16. The image forming apparatus according to claim 15, wherein the constituent part is a motor, and wherein the circuit board is configured such that;

on the first surface, a first motor driver configured to drive the motor is mountable as the first integrated circuit; and on the second surface, a second motor driver configured to drive the motor is mountable as the second integrated circuit.

* * * * *